(12) United States Patent
Ramprasad

(10) Patent No.: US 8,980,133 B2
(45) Date of Patent: *Mar. 17, 2015

(54) SEMICONDUCTOR NANOCRYSTALS AND COMPOSITIONS AND DEVICES INCLUDING SAME

(75) Inventor: Dorai Ramprasad, Columbia, MD (US)

(73) Assignee: QD Vision, Inc., Lexington, MA (US)

(*) Notice: Subject to any disclaimer, the term of this patent is extended or adjusted under 35 U.S.C. 154(b) by 1013 days.

This patent is subject to a terminal disclaimer.

(21) Appl. No.: 12/454,709

(22) Filed: May 21, 2009

(65) Prior Publication Data

US 2010/0051870 A1  Mar. 4, 2010

Related U.S. Application Data

(63) Continuation of application No. PCT/US2007/024306, filed on Nov. 21, 2007.

(60) Provisional application No. 60/866,834, filed on Nov. 21, 2006, provisional application No. 60/866,843, filed on Nov. 21, 2006.

(51) Int. Cl.
| | |
|---|---|
| C09K 11/02 | (2006.01) |
| C09K 11/08 | (2006.01) |
| C09K 11/54 | (2006.01) |
| C09K 11/56 | (2006.01) |
| C09K 11/70 | (2006.01) |
| C09K 11/72 | (2006.01) |
| C09K 11/77 | (2006.01) |

(52) U.S. Cl.
CPC .................. C09K 11/565 (2013.01)
USPC ....... 252/301.6 S; 252/301.6 R; 252/301.4 S; 252/301.4 R

(58) Field of Classification Search
USPC ........ 252/301.4 R, 301.4 S, 301.6 R, 301.6 S
See application file for complete search history.

(56) References Cited

U.S. PATENT DOCUMENTS

| | | |
|---|---|---|
| 3,714,339 A | 1/1973 | Vecht |
| H429 H | 2/1988 | Harris et al. |
| 5,132,051 A | 7/1992 | Herron et al. |
| 5,152,229 A | 10/1992 | Nimmo |
| 5,162,939 A | 11/1992 | Herron et al. |
| 5,262,357 A | 11/1993 | Alivisatos et al. |
| 5,434,878 A | 7/1995 | Lawandy |
| 5,442,254 A | 8/1995 | Jaskie |
| 5,470,910 A | 11/1995 | Spanhel et al. |
| 5,474,591 A | 12/1995 | Wells et al. |
| 5,505,928 A | 4/1996 | Alivisatos et al. |
| 5,525,377 A | 6/1996 | Gallagher et al. |
| 5,527,386 A | 6/1996 | Statz |
| 5,532,184 A | 7/1996 | Kato |
| 5,534,056 A | 7/1996 | Kuehnle et al. |
| 5,559,057 A | 9/1996 | Goldstein |
| 5,576,248 A | 11/1996 | Goldstein |
| 5,607,876 A | 3/1997 | Biegelsen et al. |
| 5,637,258 A | 6/1997 | Goldburt et al. |
| 5,663,573 A | 9/1997 | Epstein et al. |
| 5,766,779 A | 6/1998 | Shi et al. |
| 5,882,779 A | 3/1999 | Lawandy |
| 5,906,670 A | 5/1999 | Dobson et al. |
| 5,908,608 A | 6/1999 | Lawandy et al. |
| 5,965,212 A | 10/1999 | Dobson et al. |
| 5,985,173 A | 11/1999 | Gray et al. |
| 5,997,958 A | 12/1999 | Sato et al. |
| 6,036,886 A | 3/2000 | Chhabra et al. |
| 6,103,868 A | 8/2000 | Heath et al. |
| 6,114,038 A | 9/2000 | Castro et al. |
| 6,179,912 B1 | 1/2001 | Barbera-Guillem et al. |
| 6,207,229 B1 | 3/2001 | Bawendi et al. |

(Continued)

FOREIGN PATENT DOCUMENTS

| | | |
|---|---|---|
| WO | WO-2005/001889 A2 | 1/2005 |
| WO | WO 2008/021962 A2 | 2/2008 |

(Continued)

OTHER PUBLICATIONS

Zhong. Alloyed ZnxCd1—xS Nanocrystals with Highly Narrow Luminescence Spectral Width. J. Am. Chem. Soc. 2003, 125, 13559-13563.*

Xie. Preparation and Characterization of Overcoated II-VI Quantum Dots. Journal of Nanoscience and Nanotechnology, vol. 5, No. 6, Jun. 2005, pp. 880-886(7).*

Donega. Single-Step Synthesis to Control the Photoluminescence Quantum Yield and Size Dispersion of CdSe Nanocrystals. J. Phys. Chem. B 2003, 107, 489-496.*

Adachi et al., Appl. Phys. Lett. 78, 1622 (2001).

(Continued)

*Primary Examiner* — Matthew E Hoban

(57) ABSTRACT

A semiconductor nanocrystal capable of emitting light with an improved photoluminescence quantum efficiency. The present invention further relates to compositions and devices including semiconductor nanocrystals capable of emitting light with an improved photoluminescence quantum efficiency. A semiconductor nanocrystal wherein the semiconductor nanocrystal is capable of emitting light with a photoluminescence quantum efficiency greater than about 50% upon excitation and including a maximum peak emission with a FWHM less than 20 nm is disclosed. Also disclosed are a device, a population of semiconductor nanocrystals, and a composition including a semiconductor nanocrystal wherein the semiconductor nanocrystal is capable of emitting light with a photoluminescence quantum efficiency greater than about 50% upon excitation and including a maximum peak emission with a FWHM less than 20 nm. A semiconductor nanocrystal that is capable of emitting light upon excitation with a photoluminescence quantum efficiency greater than about 90%. Also disclosed are a device, a population, and a composition including a semiconductor nanocrystal.

31 Claims, No Drawings

(56) References Cited

U.S. PATENT DOCUMENTS

| | | |
|---|---|---|
| 6,225,198 B1 | 5/2001 | Alivisatos et al. |
| 6,235,618 B1 | 5/2001 | Jeong-Sook et al. |
| 6,241,819 B1 | 6/2001 | Bhargava et al. |
| 6,251,303 B1 | 6/2001 | Bawendi et al. |
| 6,262,129 B1 | 7/2001 | Murray et al. |
| 6,287,928 B1 | 9/2001 | Yamashita |
| 6,294,401 B1 | 9/2001 | Jacobson et al. |
| 6,306,610 B1 | 10/2001 | Bawendi et al. |
| 6,322,901 B1 | 11/2001 | Bawendi et al. |
| 6,326,144 B1 | 12/2001 | Bawendi et al. |
| 6,329,668 B1 | 12/2001 | Razeghi |
| 6,333,110 B1 | 12/2001 | Barbera-Guillem |
| 6,379,635 B2 | 4/2002 | O'Brien et al. |
| 6,391,273 B1 | 5/2002 | Konrad et al. |
| 6,440,213 B1 | 8/2002 | Alivisatos et al. |
| 6,447,698 B1 | 9/2002 | Ihara et al. |
| 6,475,886 B2 | 11/2002 | Kim et al. |
| 6,501,091 B1 | 12/2002 | Bawendi et al. |
| 6,576,291 B2 | 6/2003 | Bawendi et al. |
| 6,617,583 B1 | 9/2003 | Bawendi et al. |
| 6,639,354 B1 | 10/2003 | Kojima et al. |
| 6,649,138 B2 | 11/2003 | Adams et al. |
| 6,682,596 B2 | 1/2004 | Zehnder et al. |
| 6,724,141 B2 | 4/2004 | Andriessen |
| 6,780,242 B2 | 8/2004 | Norris |
| 6,803,719 B1 | 10/2004 | Miller et al. |
| 6,815,064 B2 | 11/2004 | Treadway et al. |
| 6,821,559 B2 | 11/2004 | Eberspacher et al. |
| 6,838,743 B2 | 1/2005 | Yamada et al. |
| 6,838,816 B2 | 1/2005 | Su et al. |
| 6,846,565 B2 | 1/2005 | Korgel et al. |
| 6,849,862 B2 | 2/2005 | Nikolaev et al. |
| 6,855,202 B2 | 2/2005 | Alivisatos et al. |
| 6,869,545 B2 | 3/2005 | Peng et al. |
| 6,869,864 B2 | 3/2005 | Yim et al. |
| 6,872,249 B2 | 3/2005 | Peng et al. |
| 6,872,450 B2 | 3/2005 | Liu et al. |
| 6,890,777 B2 | 5/2005 | Bawendi et al. |
| 6,918,946 B2 | 7/2005 | Korgel et al. |
| 6,939,604 B1 | 9/2005 | Guyot-Sionnest et al. |
| 6,955,855 B2 | 10/2005 | Naasani |
| 6,955,856 B2 | 10/2005 | Lee et al. |
| 6,972,450 B2 | 12/2005 | Liu et al. |
| 6,977,182 B2 | 12/2005 | Sato et al. |
| 6,992,317 B2 | 1/2006 | Jain et al. |
| 7,005,669 B1 | 2/2006 | Lee |
| 7,008,559 B2 | 3/2006 | Chen |
| 7,056,471 B1 | 6/2006 | Han et al. |
| 7,068,898 B2 | 6/2006 | Buretea et al. |
| 7,147,712 B2 | 12/2006 | Zehnder et al. |
| 7,160,613 B2 | 1/2007 | Bawendi et al. |
| 7,175,948 B2 | 2/2007 | Yoshihara et al. |
| 7,199,393 B2 | 4/2007 | Park et al. |
| 7,250,082 B2 | 7/2007 | Jang et al. |
| 7,253,452 B2 | 8/2007 | Steckel et al. |
| 7,332,211 B1 | 2/2008 | Bulovic et al. |
| 7,399,429 B2 | 7/2008 | Liu et al. |
| 7,402,832 B2 | 7/2008 | Lee |
| 7,422,790 B1 | 9/2008 | Scher et al. |
| 7,632,428 B2 | 12/2009 | Peng et al. |
| 7,645,397 B2 * | 1/2010 | Parce et al. ............ 252/301.36 |
| 7,687,800 B1 | 3/2010 | Kar et al. |
| 7,776,630 B1 | 8/2010 | Kar et al. |
| 7,777,233 B2 | 8/2010 | Kahen et al. |
| 7,855,091 B1 | 12/2010 | Kar et al. |
| 7,919,012 B2 | 4/2011 | Peng et al. |
| 7,935,419 B1 | 5/2011 | Hollingsworth et al. |
| 7,964,278 B2 | 6/2011 | Banin et al. |
| 7,989,153 B2 | 8/2011 | Skipor et al. |
| 8,003,010 B2 | 8/2011 | Landry et al. |
| 8,080,437 B2 | 12/2011 | Steckel et al. |
| 8,128,249 B2 | 3/2012 | Skipor et al. |
| 8,377,333 B2 | 2/2013 | Ramprasad et al. |
| 8,404,154 B2 | 3/2013 | Breen et al. |
| 8,691,114 B2 | 4/2014 | Ramprasad et al. |
| 2001/0040232 A1 | 11/2001 | Bawendi et al. |
| 2001/0055764 A1 | 12/2001 | Empedocles et al. |
| 2002/0071952 A1 | 6/2002 | Bawendi et al. |
| 2003/0010987 A1 | 1/2003 | Banin et al. |
| 2003/0017264 A1 | 1/2003 | Treadway et al. |
| 2004/0023010 A1 | 2/2004 | Bulovic et al. |
| 2004/0033359 A1 | 2/2004 | Bawendi et al. |
| 2004/0091710 A1 | 5/2004 | Bawendi et al. |
| 2004/0110002 A1 | 6/2004 | Kim et al. |
| 2005/0012182 A1 | 1/2005 | Jang et al. |
| 2005/0031888 A1 | 2/2005 | Bawendi et al. |
| 2005/0072989 A1 | 4/2005 | Bawendi et al. |
| 2005/0088380 A1 | 4/2005 | Bulovic et al. |
| 2005/0112849 A1 | 5/2005 | Stott et al. |
| 2005/0129947 A1 | 6/2005 | Peng et al. |
| 2005/0136258 A1 | 6/2005 | Nie et al. |
| 2005/0214536 A1 | 9/2005 | Schrier et al. |
| 2005/0258418 A1 | 11/2005 | Steckel et al. |
| 2005/0274944 A1 | 12/2005 | Jang et al. |
| 2005/0287691 A1 | 12/2005 | Chen et al. |
| 2006/0001119 A1 | 1/2006 | Liu et al. |
| 2006/0014040 A1 | 1/2006 | Peng et al. |
| 2006/0014315 A1 | 1/2006 | Chan et al. |
| 2006/0019427 A1 | 1/2006 | Cao |
| 2006/0028882 A1 | 2/2006 | Qu |
| 2006/0039850 A1 | 2/2006 | Jun et al. |
| 2006/0062720 A1 | 3/2006 | Jang et al. |
| 2006/0062902 A1 | 3/2006 | Sager et al. |
| 2006/0063029 A1 | 3/2006 | Jang et al. |
| 2006/0068154 A1 | 3/2006 | Parce et al. |
| 2006/0114960 A1 | 6/2006 | Snee |
| 2006/0130741 A1 | 6/2006 | Peng et al. |
| 2006/0131361 A1 | 6/2006 | Eastman et al. |
| 2006/0157686 A1 | 7/2006 | Jang et al. |
| 2006/0157720 A1 | 7/2006 | Bawendi et al. |
| 2006/0158089 A1 | 7/2006 | Saito et al. |
| 2006/0196375 A1 | 9/2006 | Coe-Sullivan et al. |
| 2006/0232194 A1 | 10/2006 | Tung et al. |
| 2007/0049765 A1 | 3/2007 | Lucey et al. |
| 2007/0103068 A1 | 5/2007 | Bawendi et al. |
| 2007/0111324 A1 * | 5/2007 | Nie et al. ............ 436/518 |
| 2007/0116868 A1 | 5/2007 | Weiss et al. |
| 2007/0197003 A1 | 8/2007 | Yen et al. |
| 2007/0204790 A1 | 9/2007 | Alkhawaldeh et al. |
| 2007/0243382 A1 | 10/2007 | Chan et al. |
| 2007/0289491 A1 | 12/2007 | Peng et al. |
| 2008/0001167 A1 | 1/2008 | Coe-Sullivan et al. |
| 2008/0012031 A1 | 1/2008 | Jang et al. |
| 2008/0038558 A1 | 2/2008 | Landry et al. |
| 2008/0074050 A1 | 3/2008 | Chen et al. |
| 2008/0169753 A1 | 7/2008 | Skipor et al. |
| 2008/0172197 A1 | 7/2008 | Skipor et al. |
| 2008/0202383 A1 | 8/2008 | Shi |
| 2008/0252209 A1 | 10/2008 | Jang et al. |
| 2008/0277626 A1 | 11/2008 | Yang |
| 2008/0296534 A1 | 12/2008 | Lifshitz et al. |
| 2009/0001385 A1 | 1/2009 | Skipor et al. |
| 2009/0001403 A1 | 1/2009 | Skipor et al. |
| 2009/0002806 A1 | 1/2009 | Skipor et al. |
| 2009/0017268 A1 | 1/2009 | Skipor et al. |
| 2009/0059554 A1 | 3/2009 | Skipor et al. |
| 2009/0152567 A1 | 6/2009 | Comerford et al. |
| 2009/0162011 A1 | 6/2009 | Coe-Sullivan et al. |
| 2009/0174022 A1 | 7/2009 | Coe-Sullivan et al. |
| 2009/0181478 A1 | 7/2009 | Cox et al. |
| 2009/0208753 A1 | 8/2009 | Coe-Sullivan et al. |
| 2009/0215208 A1 | 8/2009 | Coe-Sullivan et al. |
| 2009/0215209 A1 | 8/2009 | Anc et al. |
| 2009/0251759 A1 | 10/2009 | Domash et al. |
| 2009/0278141 A1 | 11/2009 | Coe-Sullivan et al. |
| 2009/0280586 A1 | 11/2009 | Coe-Sullivan |
| 2009/0283742 A1 | 11/2009 | Coe-Sullivan et al. |
| 2009/0283743 A1 | 11/2009 | Coe-Sullivan et al. |
| 2009/0283778 A1 | 11/2009 | Coe-Sullivan et al. |
| 2009/0286338 A1 | 11/2009 | Coe-Sullivan |
| 2010/0001256 A1 | 1/2010 | Coe-Sullivan et al. |
| 2010/0014799 A1 | 1/2010 | Bulovic et al. |
| 2010/0025595 A1 | 2/2010 | Bawendi et al. |
| 2010/0044635 A1 | 2/2010 | Breen et al. |

(56) References Cited

U.S. PATENT DOCUMENTS

| | | | |
|---|---|---|---|
| 2010/0044636 A1 | 2/2010 | Remaprsad et al. |
| 2010/0051870 A1 | 3/2010 | Ramprasad |
| 2010/0051901 A1 | 3/2010 | Kazlas et al. |
| 2010/0052512 A1 | 3/2010 | Clough et al. |
| 2010/0068468 A1 | 3/2010 | Coe-Sullivan et al. |
| 2010/0132770 A1 | 6/2010 | Beatty et al. |
| 2010/0134520 A1 | 6/2010 | Coe-Sullivan et al. |
| 2010/0243053 A1 | 9/2010 | Coe-Sullivan et al. |
| 2010/0264371 A1 | 10/2010 | Nick |
| 2010/0265307 A1 | 10/2010 | Linton et al. |
| 2010/0283014 A1 | 11/2010 | Breen et al. |
| 2010/0283036 A1 | 11/2010 | Coe-Sullivan et al. |
| 2010/0283072 A1 | 11/2010 | Kazlas et al. |
| 2010/0289001 A1 | 11/2010 | Kahen et al. |
| 2010/0289003 A1 | 11/2010 | Kahen et al. |
| 2010/0314646 A1 | 12/2010 | Breen et al. |
| 2011/0081538 A1 | 4/2011 | Linton |
| 2011/0095261 A1 | 4/2011 | Kazlas |
| 2011/0127932 A1 | 6/2011 | Halpert et al. |
| 2011/0245533 A1 | 10/2011 | Breen et al. |
| 2013/0221291 A1 | 8/2013 | Ramprasad et al. |
| 2013/0234109 A1 | 9/2013 | Breen et al. |

FOREIGN PATENT DOCUMENTS

| | | | |
|---|---|---|---|
| WO | WO 2008/021962 A3 | 2/2008 |
| WO | WO-2008/063653 A3 | 5/2008 |

OTHER PUBLICATIONS

Bailey, et al., "Alloyed semiconductor quantum dots: tuning the optical properties without changing the particle size", J. Am. Chem. Soc., 2003, 125, 7100-7106.
Bulovic et al., Semiconductors and Semimetals 64, 255 (2000).
Cao, et al., "Growth and properties of semiconductor core/shell nanocrystals with InAs cores", J, Am. Chem. Soc., 2000, 122, 9692-9702.
Chen, et al., "Colloidal ZnSe, ZnSe/ZnS, and ZnSe/ZnSeS quantum dots synthesized from ZnO", J. Phys. Chem. B, 204, 108, 17119-17123, (2004).
Cizeron, J., et al., "Solid solution of $Cd_yZn_{1-y}S$ nanosized particles: photophysical properties", J. Phys. Chem B, 1997, 101 (44), pp. 8887-8891.
Final Office Action, dated Mar. 30, 2011, in U.S. Appl. No. 12/454,705 of Kazlas, et al., filed May 21, 2009.
Final Office Action, dated Sep. 23, 2011, in U.S. Appl. No. 12/454,701 of Breen, et al., filed May 21, 2009.
Final Office Action, dated Sep. 9, 2011, in U.S. Appl. No. 12/454,703 of Ramprasad, et al., filed May 21, 2009.
D'Andrade et al., MRS Fall Meeting, BB6.2 (2001).
Dabbousi, et al, << (CdSe)ZnS Core-Shell Quantum Dots : Synthesis and Characterization of a Size Series of Highly Luminescent Nanocrystallites >>, J. Phys. Chem., 101, 9463 (1997).
Dirr et al., Jpn. J. Appl. Phys. 37, 1457 (1998).
Eason, et al., "High-brightness blue and green light-emitting diodes", Appl. Phys. Lett., 66 (2) 115,, Jan. 9, 1995.
Empedocles, et al., "Photoluminescence spectroscopy of single CdSe nanocrystallite quantum dots". Phys. Rev. Lett. vol. 77, No. 18, 1996, pp. 3873 et seq.
Harrison, et al., "Wet chemical synthesis and spectroscopic study of CdHgTe nanocrystals with strong near-infrared luminescence", Mater. Sci. & Engineering B69-70 (2000) 355-360.
Hines, et al., "Bright UV-blue luminescent colloidal ZnSe nanocrystals" J. Phys. Chem. B., vol. 102, No. 19, 1998, pp. 3655 et seq.
Hines, et al., "Synthesis and characterization of highly luminescing ZnS-capped CdSe nanocrystals", J. Phys. Chem., 1996, 100, 468-471.
Ivanov, et al., "Light amplification using inverted core/shell nanocrystals: towards lasing in the single-exciton regime", J. Phys. Chem. B 2004, 108, 10625-10630.

Jang, et al., "High quality CdSeS nanocrystals synthesized by facile single injection process and their electroluminescence", Chem. Commun., 2003, 2964-2966.
Jiang, et al., "Optimizing the synthesis of red- to near-IR-emitting CdS-capped $CdTe_xSe_{1-x}$ alloyed quantum dots for biomedical imaging". Chem. Mater., 2006, 18, 4845-4854.
Jonathan S. Steckel, Ph.D., Thesis entitled: "The Synthesis of Inorganic Semiconductor Nanocrystalline Materials for the Purpose of Creating Hybrid Organic/Inorganic Light-Emitting Devices", Massachusetts Institute of Technology, Sep. 2006.
Jun, et al., "Interfused semiconductor nanocrystals: brilliant blue photoluminescence and electroluminescence", Chem. Comm., 2005, 4616-4618.
Kim, S-W., et al., "Engineering $InAs_xP_{1-x}/InP/SnSe$ III-V alloyed core/shell quantum dots for the near-infrared", J. Amer. Chem. Soc., 2005, 127, 10526-10532.
Korgel, et al., "Controlled synthesis of mixed core and layered (Zn,Cd)S and (Hg,Cd)S nanocrystals within phosphatidylcholine vesicles", Langmuir 2000, 16, 3588-3594.
Li, et al., "High quality ZnSe and ZnS nanocrystals formed by activating zinc carboxylate precursors", Nano Letters, 2004, vol. 4, No. 11, 2261-2264.
Lim, et al., "Preparation of highly luminescent nanocrystals and their application in light-emitting diodes", Adv. Mater., 2007, 10, 1827-1832.
Liu, et al., "Mechanistic study of precursor evolution in colloidal group II-VI semiconductor nanocrystal synthesis", J. Am. Chem. Soc., 2007, 2129, 305-312.
McBride, J., et al., "Structural Basis for Near Unity Quantum Yield Core/Shell Nanostructures", Nano Letters, 2006, vol. 6, No. 7, 1496-1501.
Moeller, et al., Quantum-dot light-emitting devices for displays, Information Display, Feb. 2006, pp. 2-6.
Murray, Christopher Bruce, MIT PhD Thesis, entitled "Synthesis and Characterization of II-VI Quantum Dots and Their Assembly into 3D Quantum dot Superlattices" Sep. 1993.
Murray, et al., "Synthesis and Characterization of Nearly Monodisperse CdE (E=S, Se, Te) Semiconductor Nanocrystallites", J. Am. Chem. Soc., 115:8706 (1993).
PCT/US2007/024305 International Search Report and Written Opiinion (related to copending application), dated Apr. 15, 2008.
PCT/US2007/024306 International Search Report and Written Opiinion (related to present U.S. Appl. No. 12/454,709, filed May 21, 2009), dated Apr. 28, 2008.
PCT/US2007/024310 International Search Report and Written Opiinion (related to copending U.S. Appl. No. 12/454,705, filed May 21, 2009), dated May 27, 2008.
PCT/US2007/024312 International Search Report and Written Opiinion (related to copending U.S. Appl. No. 12/454,703, filed May 21, 2009), dated Apr. 8, 2008.
Petrov, "Size and band-gap dependences of the first hyperpolarizability of $Cd_xZn_{1-x}S$ nanocrystals", J. Phys. Chem. B 2002, 106, 5325-5334.
Prostiere, et al., "Highly luminescent $Cd_{1-x}Zn_xSe/ZnSe$ core/shell nanocrystals emitting in the blue-green spectral region", Small, 2007, 3. No. 3, 399-403.
Qu, et al., "Control of photoluminescence properties of CdSe nanocrystals in growth", J. Am. Chem. Soc., vol. 124, No. 9, 2002, pp. 2049 et seq.
Reiss, P., et al., "Core/Shell Semiconductor Nanocrystals", Wiley InterScience, 2009, 5, No. 2, 154-168.
Seedorf, et al., Comparative study of molecular beam and migration-enhanced epitaxy of ZnCdSe quantum wells: influence on interface and composition fluctuations, J. Cryst. Growth, 214/215 (2000) 602-605.
Shan, et al., "Growth and evolution of ZnCdSe quantum dots", J. Vac. Sci. Technol. B, 20(3), May/Jun. 2002, pp. 1102-1106.
Shih, et al., "Photoluminescence of $ZnSe_xTe_{1-x}/ZnTe$ multiple-quantum-well structures grown by molecular-beam epitaxy", J. Appl. Phys., 2004, vol. 96, No. 12, 7267-7271.

(56) References Cited

OTHER PUBLICATIONS

Steckel, et al., "Blue luminescence from (CdS)ZnS Core-Shell Nanocrystals", Agnew. Chem. Int. Ed., 2004, 43, 2154-2158.

Steckel, et al., "Color-saturated green-emitting QD-LEDs", Agnew. Chem. Int. Ed., 2006, 45, 5796-5799.

Talapin, et al., "Highly luminescent monodisperse CdSe and CdSe/ZnS nanocrystals synthesized in a hexadecylamine-trioctylphosphine oxide—trioctyl phosphine mixture", Nano Letters, 2001, vol. 1, No. 4, 207-211.

Wang, et al., "Room-temperature synthesis and characterization of nanocrystalline CdS, ZnS, and $CdxZn_{1-x}S$", Chem. Mater., 2002, 14, 3028-3033.

Xie, et al., "Synthesis and characterization of highly luminescent CdSe-core CdZn0.5Cd0.5/ZnS multishell nanocrystals", J. Amer. Chem. Soc., 2005, 127, 7480-7488.

Xing, et al., "Bioconjugated quantum dots for multiplexed and quantitative immunohistochemistry", Nature Protocols, 2007, vol. 2, No. 5, 1152-1165.

Yamasaki et al., Appl. Phys. Lett. 76, 1243 (2000).

Yu, et al., "Formation of high-quality CdS and other II-VI semiconductor nanocrystals in noncoordinating solvents: tunable reactivity of monomers". Agnew. Chem. Int. Ed., 2002, 41, No. 13, 2368-2371.

Zhong, et al., "Composition-tunable $ZnxCd_{1-x}Se$ nanocrystals with high luminescence and stability", J. Am. Chem. Soc., 2003, 125, 8589-8594.

Zhong, et al., "Embryonic nuclei-induced alloying process for the reproducible synthesis of blue-emitting $ZnxCd_{1-x}Se$ nanocrystals with long-time thermal stability in size distribution and emission wavelength", J. Phys. Chem. B, 2004, 108, 15552-15559.

Zhong, et al., High-quality violet-to red-emitting ZnSe/CdSe core/shell nanocrystals, Chem. Mater., 2006, 17, 4038-4042.

\* cited by examiner

SEMICONDUCTOR NANOCRYSTALS AND COMPOSITIONS AND DEVICES INCLUDING SAME

This application is a continuation of commonly owned PCT Application No. PCT/US2007/024306 filed 21 Nov. 2007, which was published in the English language as PCT Publication No. WO 2008/063653 on 29 May 2008. The PCT Application claims priority to U.S. Application Nos. 60/866,834, filed 21 Nov. 2006, and 60/866,843 filed 21 Nov. 2006. The disclosures of each of the foregoing applications are hereby incorporated herein by reference in their entireties.

TECHNICAL FIELD OF THE INVENTION

The technical field of the invention relates to semiconductor nanocrystals and compositions and devices including same.

SUMMARY OF THE INVENTION

The present invention relates to a semiconductor nanocrystal capable of emitting light with an improved photoluminescence quantum efficiency. The present invention further relates to compositions and devices including semiconductor nanocrystals capable of emitting light with an improved photoluminescence quantum efficiency.

Photoluminescence quantum efficiency (also referred to as quantum yield or solution quantum yield) represents the percent of absorbed photons that are reemitted as photons.

In accordance with one aspect of the invention there is provided a semiconductor nanocrystal wherein the semiconductor nanocrystal is capable of emitting light with a photoluminescence (PL) quantum efficiency greater than about 50% upon excitation and including a maximum peak emission with a FWHM less than 20 nm.

In certain embodiments, the semiconductor nanocrystal is capable of emitting light with a photoluminescence quantum efficiency greater than about 60% upon excitation.

In certain embodiments, the semiconductor nanocrystal is capable of emitting light with a photoluminescence quantum efficiency greater than about 65% upon excitation.

In certain embodiments, the semiconductor nanocrystal is capable of emitting light with a photoluminescence quantum efficiency greater than about 70% upon excitation.

In certain embodiments, the semiconductor nanocrystal is capable of emitting light with a photoluminescence quantum efficiency greater than about 75% upon excitation.

In certain embodiments, the semiconductor nanocrystal is capable of emitting light with a photoluminescence quantum efficiency greater than about 80% upon excitation.

In certain embodiments, the semiconductor nanocrystal is capable of emitting light with a photoluminescence quantum efficiency greater than about 85% upon excitation.

In certain embodiments, the semiconductor nanocrystal is capable of emitting light with a photoluminescence quantum efficiency greater than about 90% upon excitation.

In certain embodiments, the semiconductor nanocrystal is capable of emitting light with a photoluminescence quantum efficiency greater than about 95% upon excitation.

In certain embodiments, the semiconductor nanocrystal is capable of emitting light with a photoluminescence quantum efficiency of about 100% upon excitation.

Photoluminescence quantum efficiency (also referred to as quantum yield or solution quantum yield) represents the percent of absorbed photons that are reemitted as photons.

In certain embodiments, the semiconductor nanocrystal is capable of emitting blue light including a maximum peak emission at a wavelength not greater than about 470 nm.

In certain embodiments the semiconductor nanocrystal can comprise a first semiconductor material.

In certain embodiments, the semiconductor nanocrystal comprises a core/shell structure wherein the core comprises a first semiconductor material and a shell comprising a second semiconductor material wherein the shell is disposed over at least a portion of a surface of the core.

For example, in the foregoing embodiments, the first semiconductor material can comprise one or more chemical elements. Non-limiting examples of first semiconductor materials include compositions including a chemical element from Group IVA and compositions represented by the general formula MA wherein M comprises at least one chemical element and A comprises at least one chemical element. In certain embodiments, the first semiconductor material can comprise at least three or more different chemical elements. Non-limiting examples of first semiconductor materials include compositions represented by the general formula MA wherein M comprises at least one chemical element and A comprises at least one chemical element. In certain other examples, M can comprise at least two different chemical elements and A can comprise at least one chemical element or M can comprise at least one chemical element and A can comprise at least two different chemical elements. In certain examples, M comprises one or more elements from Group IA (for example, lithium, sodium, rubidium, and cesium), Group IIA (for example, beryllium, magnesium, calcium, strontium, and barium), Group IIB (for example, Zn, Cd, and Hg), Group IIIA (for example, B, Al, Ga, In, and Tl), Group IVA (for example, Si, Ge, Sn, and Pb), or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, A comprises one or more elements selected from Group VA (for example, nitrogen, phosphorus, arsenic, antimony, and bismuth) and/or Group VIA (for example, oxygen, sulfur, selenium, and tellurium). Other semiconductor materials suitable for inclusion in the core can be used. The first semiconductor material is preferably an inorganic semiconductor material.

In certain embodiments, M comprises one or more chemical elements from Group IIA and/or Group IIB and A comprises one or more chemical elements from Group VIA.

In certain embodiments, M comprises one or more chemical elements from Group IIA and/or Group IIB and A comprises one or more chemical elements from Group VA.

In certain other embodiments, M comprises one or more chemical elements from Group IIIA and A comprises one or more chemical elements from Group VA.

In certain embodiments, M comprises one or more chemical elements from Group IVA and A comprises one or more chemical elements from Group VIA.

In certain embodiments, M comprises one or more chemical elements from Group IA and/or Group IIIA and A comprises one or more chemical elements from Group VIA.

In certain embodiments, M comprises one or more chemical elements from Group IIA and/or Group IVA and A comprises one or more chemical elements from Group VA.

In certain embodiments, the first semiconductor material comprises zinc, cadmium, and sulfur.

In certain other embodiments, the first semiconductor material does not include an element from Group IIA.

In certain embodiments, the first semiconductor material comprises $Zn_xCd_{1-x}S$, wherein $0<x<1$. In certain embodiments, $0<x\leq 0.5$. In certain embodiments, $0<x\leq 0.3$. In certain embodiments, $0.05<x<0.2$. In certain embodiments, $0.1\leq x\leq 0.15$ In certain embodiments, x is from about 0.10 to about 0.12.

In certain embodiments wherein $x\geq 0.1$, a maximum peak emission at a wavelength not greater than about 470 nm can be obtained.

In certain embodiments, the first semiconductor material can comprise an alloy of three or more chemical elements.

In certain embodiments, the first semiconductor material can comprise a homogeneous alloy of the three or more chemical elements.

In semiconductor nanocrystals comprising a core/shell structure, the shell comprises a second semiconductor material. For example, the second semiconductor material can comprise one or more chemical elements. Non-limiting examples of second semiconductor materials include compositions including a chemical element from Group IVA and compositions represented by the general formula M'A' wherein M' comprises at least one chemical element and A' comprises at least one chemical element. In certain embodiments, the second semiconductor material can comprise at least three or more different chemical elements. Non-limiting examples of second semiconductor materials include compositions represented by the general formula M'A' wherein M' comprises at least one chemical element and A' comprises at least one chemical element. In certain other examples, M' can comprise at least two different chemical elements and A' can comprise at least one chemical element or M' can comprise at least one chemical element and A' can comprise at least two different chemical elements. In certain examples, M' comprises one or more elements from Group IA (for example, lithium, sodium, rubidium, and cesium), Group IIA (for example, beryllium, magnesium, calcium, strontium, and barium), Group IIB (for example, Zn, Cd, and Hg), Group IIIA (for example, B, Al, Ga, In, and Tl), Group IVA (for example, Si, Ge, Sn, and Pb), or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, A' comprises one or more elements selected from Group VA (for example, nitrogen, phosphorus, arsenic, antimony, and bismuth) and/or Group VIA (for example, oxygen, sulfur, selenium, and tellurium). Other semiconductor materials suitable for inclusion in the shell can be used. The second semiconductor material is preferably an inorganic semiconductor material.

In certain embodiments, M' comprises one or more chemical elements from Group IIA and/or Group IIB and A' comprises one or more chemical elements from Group VIA.

In certain embodiments, M' comprises one or more chemical elements from Group IIA and/or Group IIB and A' comprises one or more chemical elements from Group VA.

In certain other embodiments, M' comprises one or more chemical elements from Group IIIA and A' comprises one or more chemical elements from Group VA.

In certain embodiments, M' comprises one or more chemical elements from Group IVA and A' comprises one or more chemical elements from Group VIA.

In certain embodiments, M' comprises one or more chemical elements from Group IA and/or Group IIIA and A' comprises one or more chemical elements from Group VIA.

In certain embodiments, M' comprises one or more chemical elements from Group IIA and/or Group IVA and A' comprises one or more chemical elements from Group VA.

In certain embodiments, the second semiconductor material does not include an element from Group IIA.

In certain embodiments, the second semiconductor material is not an oxide.

In certain other embodiments, the second semiconductor material comprises zinc and sulfur. In certain embodiments, the second semiconductor material comprises ZnS.

In certain embodiments, the shell can comprise an alloy of three or more chemical elements.

In certain embodiments, the shell can comprise a homogeneous alloy of three or more chemical elements.

In certain embodiments, the first semiconductor material comprises $Zn_xCd_{1-x}S$, wherein $0<x<1$ and the second semiconductor material comprises ZnS.

In accordance with another aspect of the invention there is provided a semiconductor nanocrystal wherein the semiconductor nanocrystal is capable of emitting light with a photoluminescence quantum efficiency greater than about 90% upon excitation. In certain embodiments, the semiconductor nanocrystal is capable of emitting light with a photoluminescence quantum efficiency greater than about 95% upon excitation.

In certain embodiments, the semiconductor nanocrystal is capable of emitting light with a photoluminescence quantum efficiency of about 100% upon excitation.

In certain embodiments, the light includes a maximum peak emission with a full width at half maximum of not more than 50 nm, not more than 40 nm, not more than 30 nm, or not more than 20 nm. In certain embodiments, a semiconductor nanocrystal comprises a first semiconductor material. In accordance with another aspect of the invention there is provided a semiconductor nanocrystal including a core comprising a first semiconductor material and a shell disposed over at least a portion of the core, the shell comprising a second semiconductor material, wherein the semiconductor nanocrystal is capable of emitting light with a photoluminescence quantum efficiency greater than about 90% upon excitation.

In certain embodiments, the semiconductor nanocrystal is capable of emitting light with a photoluminescence quantum efficiency greater than about 95% upon excitation.

In certain embodiments, the semiconductor nanocrystal is capable of emitting light with a photoluminescence quantum efficiency of about 100% upon excitation.

In certain embodiments, the light includes a maximum peak emission with a full width at half maximum of not more than 50 nm, not more than 40 nm, not more than 30 nm, or not more than 20 nm.

Photoluminescence quantum efficiency (also referred to as quantum yield or solution quantum yield) represents the percent of absorbed photons that are reemitted as photons.

In certain embodiments of a semiconductor nanocrystal or a core, a first semiconductor material comprises one or more chemical elements. In certain embodiments, a first semiconductor material comprises two or more chemical elements. Non-limiting examples of first semiconductor materials include compositions including a chemical element from Group IVA and compositions represented by the general formula MA wherein M comprises at least one chemical element and A comprises at least one chemical element. In certain examples, M comprises one or more elements from Group IA (for example, lithium, sodium, rubidium, and cesium), Group IIA (for example, beryllium, magnesium, calcium, strontium, and barium), Group IIB (for example, Zn, Cd, and Hg), Group IIIA (for example, B, Al, Ga, In, and Tl), Group IVA (for example, Si, Ge, Sn, and Pb), or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, A comprises one or more elements selected from Group VA (for example, nitrogen, phosphorus, arsenic, antimony, and bismuth) and/or Group VIA (for example, oxygen, sulfur, selenium, and tellurium). Other semiconductor materials suitable for inclusion in the core can be used. The first semiconductor material is preferably an inorganic semiconductor material.

In certain embodiments, M comprises one or more chemical elements from Group IIA and/or Group IIB and A comprises one or more chemical elements from Group VIA. In certain embodiments, M comprises one or more chemical elements from Group IIA and/or Group IIB and A comprises one or more chemical elements from Group VA. In certain other embodiments, M comprises one or more chemical elements from Group IIIA and A comprises one or more chemical elements from Group VA.

In certain embodiments, M comprises one or more chemical elements from Group IVA and A comprises one or more chemical elements from Group VIA. In certain embodiments, M comprises one or more chemical elements from Group IA and/or Group IIIA and A comprises one or more chemical elements from Group VIA. In certain embodiments, M comprises one or more chemical elements from Group IIA and/or Group IVA and A comprises one or more chemical elements from Group VA. In certain embodiments, a first semiconductor material comprises zinc, cadmium, and sulfur. In certain embodiments, a first semiconductor material comprises $Zn_xCd_{1-x}S$, wherein $0<x<1$. In certain embodiments, $0<x\leq0.5$. In certain embodiments, $0<x\leq0.3$. In certain embodiments, $0.05<x<0.2$. In certain embodiments, $0.1\leq x\leq0.15$ In certain embodiments, x is from about 0.10 to about 0.12. In certain other embodiments, the first semiconductor material does not include an element from Group IIA.

In certain embodiments, the first semiconductor material can comprise an alloy of three or more chemical elements. In certain embodiments, the first semiconductor material can comprise a homogeneous alloy of the three or more chemical elements.

In certain embodiments of a semiconductor nanocrystal including a core and a shell, the shell comprises a second semiconductor material. In certain embodiments, the second semiconductor material comprises one or more chemical elements. In certain embodiments, the second semiconductor material comprises two or more chemical elements. Non-limiting examples of second semiconductor materials include compositions including a chemical element from Group IVA and compositions represented by the general formula M'A' wherein M' comprises at least one chemical element and A' comprises at least one chemical element. In certain examples, M' comprises one or more elements from Group IA (for example, lithium, sodium, rubidium, and cesium), Group IIA (for example, beryllium, magnesium, calcium, strontium, and barium), Group IIB (for example, Zn, Cd, and Hg), Group IIIA (for example, B, Al, Ga, In, and Ti), Group IVA (for example, Si, Ge, Sn, and Pb), or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, A' comprises one or more elements selected from Group VA (for example, nitrogen, phosphorus, arsenic, antimony, and bismuth) and/or Group VIA (for example, oxygen, sulfur, selenium, and tellurium). Other semiconductor materials suitable for inclusion in the shell can be used. The second semiconductor material is preferably an inorganic semiconductor material.

In certain embodiments, M' comprises one or more chemical elements from Group IIA and/or Group IIB and A' comprises one or more chemical elements from Group VIA.

In certain embodiments, M' comprises one or more chemical elements from Group IIA and/or Group IIB and A' comprises one or more chemical elements from Group VA. In certain other embodiments, M' comprises one or more chemical elements from Group IIIA and A' comprises one or more chemical elements from Group VA.

In certain embodiments, M' comprises one or more chemical elements from Group IVA and A' comprises one or more chemical elements from Group VIA. In certain embodiments, M' comprises one or more chemical elements from Group IA and/or Group IIIA and A' comprises one or more chemical elements from Group VIA. In certain embodiments, M' comprises one or more chemical elements from Group IIA and/or Group IVA and A' comprises one or more chemical elements from Group VA. In certain embodiments, the second semiconductor material does not include an element from Group IIA.I certain embodiments, the second semiconductor material is not an oxide.

In certain other embodiments, the second semiconductor material comprises zinc and sulfur. In certain embodiments, the second semiconductor material comprises ZnS.

In certain embodiments of the invention, the shell can comprise an alloy of three or more chemical elements. In certain embodiments, the shell can comprise a homogeneous alloy of three or more chemical elements.

In certain embodiments, the first semiconductor material comprises $Zn_xCd_{1-x}S$, wherein $0<x<1$ and the second semiconductor material comprises ZnS.

In accordance with another aspect of the invention, there is provided a population of semiconductor nanocrystals, wherein the population is capable of emitting light with a photoluminescence quantum efficiency greater than about 50% upon excitation and includes a maximum peak emission with a FWHM less than 20 nm.

In certain embodiments, the population is capable of emitting blue light including a maximum peak emission at a wavelength not greater than about 470 nm.

Examples of semiconductor nanocrystals that can be included in the population are described above and in the detailed description.

In certain embodiments, the population is capable of emitting light with a photoluminescence quantum efficiency greater than about 60% upon excitation.

In certain embodiments, the population is capable of emitting light with a photoluminescence quantum efficiency greater than about 65% upon excitation.

In certain embodiments, the population is capable of emitting light with a photoluminescence quantum efficiency greater than about 70% upon excitation.

In certain embodiments, the population is capable of emitting light with a photoluminescence quantum efficiency greater than about 75% upon excitation.

In certain embodiments, the population is capable of emitting light with a photoluminescence quantum efficiency greater than about 80% upon excitation.

In certain embodiments, the population is capable of emitting light with a photoluminescence quantum efficiency greater than about 85% upon excitation.

In certain embodiments, the population is capable of emitting light with a photoluminescence quantum efficiency greater than about 90% upon excitation.

In certain embodiments, the population is capable of emitting light with a photoluminescence quantum efficiency greater than about 95% upon excitation.

In certain embodiments, the population is capable of emitting light with a photoluminescence quantum efficiency of about 100% upon excitation.

In accordance with another aspect of the invention, there is provided a population of semiconductor nanocrystals, wherein the population is capable of emitting light with a photoluminescence quantum efficiency greater than about 90% upon excitation. In certain embodiments, the semiconductor nanocrystal includes a core comprising a first semiconductor material and a shell disposed over at least a portion of the core, the shell comprising a second semiconductor material. Examples of first semiconductor materials and second semiconductor materials are described above and in the detailed description. In certain embodiments, the semiconductor nanocrystal is capable of emitting light with a photoluminescence quantum efficiency greater than about 95% upon excitation.

In certain embodiments, the semiconductor nanocrystal is capable of emitting light with a photoluminescence quantum efficiency of about 100% upon excitation.

In certain embodiments, the light includes a maximum peak emission with a full width at half maximum of not more than 50 nm, not more than 40 nm, not more than 30 nm, or not more than 20 nm.

In still a further aspect of the present invention there is provided a composition including a semiconductor nanocrystal wherein the semiconductor nanocrystal is capable of emitting light with a photoluminescence quantum efficiency greater than about 50% upon excitation and including a maximum peak emission with a FWHM less than 20 nm.

Examples of semiconductor nanocrystals are described above and in the detailed description.

In certain embodiments, the semiconductor nanocrystal is capable of emitting light with a photoluminescence quantum efficiency greater than about 60% upon excitation.

In certain embodiments, the semiconductor nanocrystal is capable of emitting light with a photoluminescence quantum efficiency greater than about 65% upon excitation.

In certain embodiments, the semiconductor nanocrystal is capable of emitting light with a photoluminescence quantum efficiency greater than about 70% upon excitation.

In certain embodiments, the semiconductor nanocrystal is capable of emitting light with a photoluminescence quantum efficiency greater than about 75% upon excitation.

In certain embodiments, the semiconductor nanocrystal is capable of emitting light with a photoluminescence quantum efficiency greater than about 80% upon excitation.

In certain embodiments, the semiconductor nanocrystal is capable of emitting light with a photoluminescence quantum efficiency greater than about 85% upon excitation.

In certain embodiments, the semiconductor nanocrystal is capable of emitting light with a photoluminescence quantum efficiency greater than about 90% upon excitation.

In certain embodiments, the semiconductor nanocrystal is capable of emitting light with a photoluminescence quantum efficiency greater than about 95% upon excitation.

In certain embodiments, the semiconductor nanocrystal is capable of emitting light with a photoluminescence quantum efficiency of about 100% upon excitation.

In still a further aspect of the present invention there is provided a composition including a semiconductor nanocrystal that is capable of emitting light with a photoluminescence quantum efficiency greater than about 90% upon excitation. In certain embodiments, the semiconductor nanocrystal includes a core comprising a first semiconductor material and a shell disposed over at least a portion of the core, the shell comprising a second semiconductor material. Examples of first semiconductor materials and second semiconductor materials are described above and in the detailed description. In certain embodiments, the semiconductor nanocrystal is capable of emitting light with a photoluminescence quantum efficiency greater than about 95% upon excitation.

In certain embodiments, the semiconductor nanocrystal is capable of emitting light with a photoluminescence quantum efficiency of about 100% upon excitation.

In certain embodiments, the light includes a maximum peak emission with a full width at half maximum of not more than 50 nm, not more than 40 nm, not more than 30 nm, or not more than 20 nm. In accordance with various aspects and embodiments of compositions of the present invention, the composition further includes a polymer.

In accordance with various aspects and embodiments of compositions of the present invention, the composition further includes a pre-polymer.

In accordance with various aspects and embodiments of compositions of the present invention, the composition further includes an oligomer.

In accordance with various aspects and embodiments of compositions of the present invention, the composition further includes a small molecule.

In accordance with various aspects and embodiments of compositions of the present invention, the composition further includes an inorganic material.

In accordance with various aspects and embodiments of compositions of the present invention, the composition comprises a matrix. The matrix can comprise an organic or inorganic material. In accordance with various aspects and embodiments of compositions of the present invention, the semiconductor nanocrystals are dispersed in the matrix. In certain embodiments, the semiconductor nanocrystals are randomly dispersed in the matrix. In certain embodiments, the semiconductor nanocrystals are homogeneously dispersed in the matrix. Non-limiting examples of matrices include, but are not limited to, a polymer (e.g., polystyrene, epoxy, polyimides), a glass (e.g., silica glass), a gel (e.g., a silica gel), and any other material which is at least partially, and preferably fully, transparent to the light emitted by the semiconductor nanocrystals and in which semiconductor nanocrystals can be included. Depending on the use of the composition, the matrix can be conductive or non-conductive. Examples of preferred matrices include, but are not limited to, glass or a resin. Resins can be non-curable resins, heat-curable resins, or photocurable resins. More specific examples of resins can be in the form of either an oligomer or a polymer, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like. Examples of a photopolymerizable resin include an acrylic acid or methacrylic acid based resin containing a reactive vinyl group, a photo-crosslinkable resin which generally contains a photo-sensitizer, such as polyvinyl cinnamate, or the like. A heat-curable resin may selected when the photo-sensitizer is not used. Matrix resins may be used individually or in combination of two or more. Other matrix materials can be readily identified by one of ordinary skill in the art. In certain embodiments, a composition including a matrix may further include scatterers (e.g, without limitation, metal or metal oxide particles, air bubbles, and glass and polymeric beads (solid or hollow), and/or other optional additives typically used in the desired end-use application for the composition.

In accordance with various aspects and embodiments of compositions of the present invention, the composition further includes a liquid medium, In certain embodiments, compositions in accordance with the present invention including a liquid medium comprise an ink. Examples of suitable liquids and other optional additives that may be included in an ink are described in International Application No. PCT/US2007/00873 of Seth Coe-Sullivan et al., for "Composition Including Material, Methods Of Depositing Material, Articles Including Same And Systems For Deposition Material", filed 9 Apr. 2007, and International Application No. PCT/US2007/014711 of Seth Coe-Sullivan et al., for "Methods For Depositing Nanomaterial, Methods For Fabricating A device, And Methods For Fabricating An Array Of Devices", filed 25 Jun. 2007, which are each hereby incorporated herein by reference in their entireties.

In accordance with various aspects and embodiments of compositions of the present invention the composition further includes a non-polar liquid in which the semiconductor nanocrystal is dispersible.

In accordance with various aspects and embodiments of compositions of the present invention, the composition further includes a polar liquid in which the semiconductor nanocrystal is dispersible.

In a still further aspect of the invention there is provided a device including a semiconductor nanocrystal wherein the semiconductor nanocrystal is capable of emitting light with a photoluminescence (PL) quantum efficiency greater than about 50% upon excitation and including a maximum peak emission with a FWHM less than 20 nm.

In certain embodiments, a device comprises a layer comprising a plurality of semiconductor nanocrystals and means for exciting the semiconductor nanocrystals, wherein the plurality of semiconductor nanocrystals includes at least one semiconductor nanocrystal wherein the semiconductor nanocrystal is capable of emitting light with a photoluminescence quantum efficiency greater than about 50% upon excitation and including a maximum peak emission with a FWHM less than 20 nm. The layer can be continuous or non-continuous. The layer can be patterned or unpatterned.

Examples of semiconductor nanocrystals are described above and in the detailed description.

In certain embodiments, the at least one semiconductor nanocrystal is capable of emitting light with a photoluminescence quantum efficiency greater than about 60% upon excitation.

In certain embodiments, the at least one semiconductor nanocrystal is capable of emitting light with a photoluminescence quantum efficiency greater than about 65% upon excitation.

In certain embodiments, the at least one semiconductor nanocrystal is capable of emitting light with a photoluminescence quantum efficiency greater than about 70% upon excitation.

In certain embodiments, the at least one semiconductor nanocrystal is capable of emitting light with a photoluminescence quantum efficiency greater than about 75% upon excitation.

In certain embodiments, the at least one semiconductor nanocrystal is capable of emitting light with a photoluminescence quantum efficiency greater than about 80% upon excitation.

In certain embodiments, the at least one semiconductor nanocrystal is capable of emitting light with a photoluminescence quantum efficiency greater than about 85% upon excitation.

In certain embodiments, the at least one semiconductor nanocrystal is capable of emitting light with a photoluminescence quantum efficiency greater than about 90% upon excitation.

In certain embodiments, the at least one semiconductor nanocrystal is capable of emitting light with a photoluminescence quantum efficiency greater than about 95% upon excitation.

In certain embodiments, the at least one semiconductor nanocrystal is capable of emitting light with a photoluminescence quantum efficiency of about 100% upon excitation.

In a still further aspect of the invention there is provided a device including a semiconductor nanocrystal wherein the semiconductor nanocrystal is capable of emitting light with a photoluminescence quantum efficiency greater than about 90% upon excitation. In certain embodiments, the light includes a maximum peak emission with a full width at half maximum of not more than 50 nm, not more than 40 nm, not more than 30 nm, or not more than 20 nm.

In certain embodiments, a device comprises a layer comprising a plurality of semiconductor nanocrystals and means for exciting the semiconductor nanocrystals, wherein the plurality of semiconductor nanocrystals include one or more semiconductor nanocrystals that is capable of emitting light with a photoluminescence quantum efficiency greater than about 90% upon excitation. The layer can be continuous or non-continuous. The layer can be patterned or unpatterned.

In certain embodiments, the semiconductor nanocrystal includes a core comprising a first semiconductor material and a shell disposed over at least a portion of the core, the shell comprising a second semiconductor material. Examples of first semiconductor materials and second semiconductor materials are described above and in the detailed description. In certain embodiments, the semiconductor nanocrystal is capable of emitting light with a photoluminescence quantum efficiency greater than about 95% upon excitation.

In certain embodiments, the semiconductor nanocrystal is capable of emitting light with a photoluminescence quantum efficiency of about 100% upon excitation.

In certain embodiments, means for exciting the semiconductor nanocrystals comprises a light source.

In certain embodiments of devices in accordance with the present invention, means for exciting the semiconductor nanocrystals comprises a light source. Suitable light sources are known or can be readily ascertained by one of ordinary skill in the art.

In certain embodiments of devices in accordance with the present invention, means for exciting the semiconductor nanocrystals comprises a first electrode and a second electrode opposed to the first electrode and the layer comprising semiconductor nanocrystals is disposed between the two electrodes and in electrical communication therewith. In certain embodiments, one of the electrodes can be supported by a substrate (which can be flexible or rigid).

In certain embodiments, the device further includes at least one charge transport layer between the two electrodes. In certain embodiments, two charge transport layers are included, e.g., a hole transport layer and an electron transport layer. In certain embodiments, two charge transport layers, e.g., a hole transport layer and an electron transport layer, and a hole blocking layer are included. In certain other embodiments, additional layers can be included. Charge transport materials, hole blocking materials, and other materials that may be included in a device can be identified by a person having ordinary skill in the art. In a device including semiconductor nanocrystals capable of emitting blue light, for example, a hole transport layer comprising 4-4'-N,N'-dicarbazolyl-biphenyl (CBP) and an electron transport layer comprising 2,2',2"-(1,3,5-Benzinetriyl)-tris(1-phenyl-1-H-benzimidazole) (TBPi) can be used. U.S. Provision Patent Application No. 60/825,374, filed 12 Sep. 2006, of Seth A.

Coe-Sullivan et al., for "Light-Emitting Devices And Displays With Improved Performance". Additional information concerning devices, device structures, examples of materials for use in various device structures, etc. is discussed in U.S. Provisional Patent Application No. 60/825,374, filed 12 Sep. 2006, of Seth A. Coe-Sullivan et al., for "Light-Emitting Devices And Displays With Improved Performance", which is hereby incorporated herein by reference, and elsewhere herein.

For additional information concerning devices, light sources, and compositions see also, for example, U.S. Pat. No. 5,434,878 of Lawandy; U.S. Pat. No. 5,882,779 of Lawandy; U.S. Pat. No. 6,890,777 of Bawendi et al.; U.S. Pat. No. 6,803,719 of Miller et al. Each of the foregoing patents is hereby incorporated herein by reference in its entirety.

In certain embodiments, devices in accordance with the present invention comprise a light-emitting device. In certain other embodiments, devices in accordance with the present invention comprise a display device. In certain other embodiments, devices in accordance with the present invention comprise a solid state lighting device.

In certain embodiments of the inventions described or contemplated by this general description, the following detailed description, and claims, the semiconductor nanocrystals are preferably of a substantially monodisperse, and more preferably, of a monodisperse, size.

In certain embodiments of the inventions described or contemplated by this general description, the following detailed description, and claims, a semiconductor nanocrystal can include one or more ligands attached to the outer surface thereof.

In certain embodiments of the inventions described or contemplated by this general description, the following detailed description, and claims including a second semiconductor material, the second semiconductor material preferably has a composition that is different from the composition of the core. Although, in certain embodiments, a shell may comprise a second semiconductor material with the same composition as that of the first semiconductor material. In certain embodiments, the second semiconductor material can comprise a mixture or alloy of the two or more semiconductor materials. In certain embodiments, two or more shells can be disposed over at least a portion of the core wherein each shell can include single semiconductor material and/or a mixture of one or more semiconductor materials. Each shell may include one or more monolayers.

In certain embodiments of the inventions described or contemplated by this general description, the following detailed description, and claims, the photoluminescence quantum efficiency can be determined when the semiconductor nanocrystals are dispersed in anhydrous hexane and excited by 373 nm light at room temperature. The concentration of semiconductor nanocrystals in the dispersion can be in a range between about 0.1 to about 1 weight percent, e.g., about 10 mg/ml, etc.

The foregoing, and other aspects described herein all constitute embodiments of the present invention.

It is to be understood that both the foregoing general description and the following detailed description are exemplary and explanatory only and are not restrictive of the invention as claimed. Other embodiments will be apparent to those skilled in the art from consideration of the description, from the claims, and from practice of the invention disclosed herein.

DETAILED DESCRIPTION OF THE INVENTION

A semiconductor nanocrystal is capable of emitting light upon excitation. A semiconductor nanocrystal can be excited by irradiation with an excitation wavelength of light, by electrical excitation, or by other energy transfer.

A semiconductor nanocrystal is a nanometer sized particle, e.g., in the size range of up to about 1000 nm. In certain embodiments, a semiconductor nanocrystal can have a size in the range of up to about 100 nm. In certain embodiments, a semiconductor nanocrystal can have a size in the range up to about 20 nm (such as about 1, 2, 3, 4, 5, 6, 7, 8, 9, 10, 11, 12, 13, 14, 15, 16, 17, 18, 19, or 20 nm). In certain preferred embodiments, a semiconductor nanocrystal can have a size less than 100 Å. In certain preferred embodiments, a semiconductor nanocrystal has a size in a range from about 1 to about 6 nanometers and more particularly from about 1 to about 5 nanometers. The size of a semiconductor nanocrystal can be determined, for example, by direct transmission electron microscope measurement. Other known techniques can also be used to determine nanocrystal size.

A semiconductor nanocrystals can have various shapes. Examples of the shape of a nanocrystal include, but are not limited to, sphere, rod, disk, tetrapod, other shapes, and/or mixtures thereof.

In certain embodiments, a semiconductor nanocrystal is crystalline.

In certain embodiments the semiconductor nanocrystal can comprise a first semiconductor material.

In certain embodiments, the semiconductor nanocrystal comprises a core/shell structure wherein the core comprises a first semiconductor material and a shell comprising a second semiconductor material wherein the shell is disposed over at least a portion of a surface of the core. A semiconductor nanocrystal core surrounded by a shell is also referred to as a "core/shell" structure.

A first semiconductor material can comprise one or more chemical elements. Non-limiting examples of first semiconductor materials include compositions including a chemical element from Group IVA and compositions represented by the general formula MA wherein M comprises at least one chemical element and A comprises at least one chemical element. In certain embodiments, the first semiconductor material can comprise at least three or more different chemical elements. Non-limiting examples of first semiconductor materials include compositions represented by the general formula MA wherein M comprises at least one chemical element and A comprises at least one chemical element. In certain other examples, M can comprise at least two different chemical elements and A can comprise at least one chemical element or M can comprise at least one chemical element and A can comprise at least two different chemical elements. In certain examples, M comprises one or more elements from Group IA (for example, lithium, sodium, rubidium, and cesium), Group IIA (for example, beryllium, magnesium, calcium, strontium, and barium), Group IIB (for example, Zn, Cd, and Hg), Group IIIA (for example, B, Al, Ga, In, and Tl), Group IVA (for example, Si, Ge, Sn, and Pb), or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, A comprises one or more elements selected from Group VA (for example, nitrogen, phosphorus, arsenic, antimony, and bismuth) and/or Group VIA (for example, oxygen, sulfur, selenium, and tellurium). Other semiconductor materials suitable for inclusion in the core can be used. The first semiconductor material is preferably an inorganic semiconductor material.

In certain embodiments, M comprises one or more chemical elements from Group IIA and/or Group IIB and A comprises one or more chemical elements from Group VIA.

In certain embodiments, M comprises one or more chemical elements from Group IIA and/or Group IIB and A comprises one or more chemical elements from Group VA.

In certain other embodiments, M comprises one or more chemical elements from Group IIIA and A comprises one or more chemical elements from Group VA.

In certain embodiments, M comprises one or more chemical elements from Group IVA and A comprises one or more chemical elements from Group VIA.

In certain embodiments, M comprises one or more chemical elements from Group IA and/or Group IIIA and A comprises one or more chemical elements from Group VIA.

In certain embodiments, M comprises one or more chemical elements from Group IIA and/or Group IVA and A comprises one or more chemical elements from Group VA.

In certain embodiments, the first semiconductor material comprises zinc, cadmium, and sulfur.

In certain embodiments, the first semiconductor material comprises $Zn_xCd_{1-x}S$, wherein $0<x<1$. In certain embodiments, $0<x\leq0.5$. In certain embodiments, $0<x\leq0.3$. In certain embodiments, $0.05<x<0.2$. In certain embodiments, $0.1\leq x\leq0.15$ In certain embodiments, x is from about 0.10 to about 0.12.

In certain embodiments wherein $x\geq0.1$, a maximum peak emission at a wavelength not greater than about 470 nm can be obtained.

In certain embodiments, the first semiconductor material can comprise an alloy of three or more chemical elements.

In certain embodiments, the first semiconductor material can comprise a homogeneous alloy of the three or more chemical elements.

In embodiments of a semiconductor nanocrystal that include a core/shell structure, the shell comprises a second semiconductor material. A second semiconductor material can comprise one or more chemical elements. Non-limiting examples of second semiconductor materials include compositions including a chemical element from Group IVA and compositions represented by the general formula M'A' wherein M' comprises at least one chemical element and A' comprises at least one chemical element. In certain embodiments, the second semiconductor material can comprise at least three or more different chemical elements. Non-limiting examples of second semiconductor materials include compositions represented by the general formula M'A' wherein M' comprises at least one chemical element and A' comprises at least one chemical element. In certain other examples, M' can comprise at least two different chemical elements and A' can comprise at least one chemical element or M' can comprise at least one chemical element and A' can comprise at least two different chemical elements. In certain examples, M' comprises one or more elements from Group IA (for example, lithium, sodium, rubidium, and cesium), Group IIA (for example, beryllium, magnesium, calcium, strontium, and barium), Group IIB (for example, Zn, Cd, and Hg), Group IIIA (for example, B, Al, Ga, In, and Tl), Group IVA (for example, Si, Ge, Sn, and Pb), or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, A' comprises one or more elements selected from Group VA (for example, nitrogen, phosphorus, arsenic, antimony, and bismuth) and/or Group VIA (for example, oxygen, sulfur, selenium, and tellurium). Other semiconductor materials suitable for inclusion in the shell can be used. The second semiconductor material is preferably an inorganic semiconductor material.

In certain embodiments, M' comprises one or more chemical elements from Group IIA and/or Group IIB and A' comprises one or more chemical elements from Group VIA.

In certain embodiments, M' comprises one or more chemical elements from Group IIA and/or Group IIB and A' comprises one or more chemical elements from Group VA.

In certain other embodiments, M' comprises one or more chemical elements from Group IIIA and A' comprises one or more chemical elements from Group VA.

In certain embodiments, M' comprises one or more chemical elements from Group IVA and A' comprises one or more chemical elements from Group VIA.

In certain embodiments, M' comprises one or more chemical elements from Group IA and/or Group IIIA and A' comprises one or more chemical elements from Group VIA.

In certain embodiments, M' comprises one or more chemical elements from Group IIA and/or Group IVA and A' comprises one or more chemical elements from Group VA.

In certain other embodiments, the second semiconductor material comprises zinc and sulfur. In certain embodiments, the second semiconductor material comprises ZnS.

In certain embodiments, the shell can comprise an alloy of three or more chemical elements.

In certain embodiments, the shell can comprise a homogeneous alloy of three or more chemical elements.

In certain embodiments, the first semiconductor material comprises $Zn_xCd_{1-x}S$, wherein $0<x<1$ and the second semiconductor material comprises ZnS.

In certain embodiments, the second semiconductor material preferably has a composition that is different from the composition of the core. Although, in certain embodiments, a shell may comprise a second semiconductor material with the same composition as that of the first semiconductor material. In certain embodiments, the second semiconductor material can comprise a mixture or alloy of the two or more semiconductor materials. In certain embodiments, two or more shells can be disposed over at least a portion of the core wherein each shell can include at least one semiconductor material and/or a mixture of two or more semiconductor materials. Each shell may include one or more monolayers. In certain embodiments, more than 20 monolayers can be grown.

Shell thickness can be varied by growing a desired thickness of the shell. For example, in certain embodiments, the shell thickness can be at least about one monolayer. Preferably, the thickness is less than that at which quantum confinement is not achieved. In certain embodiments, the thickness is in the range from greater than about 0 to about 20 monolayers. In certain embodiments, the thickness is in the range from greater than about 0 to about 10 monolayers. In certain embodiments, the thickness is in the range from greater than about 0 to about 5 monolayers. In certain embodiments, the thickness is in the range from about 1 to about 5 monolayers. In certain embodiments, the thickness is in the range from about 3 to about 5 monolayers. In certain embodiments, more than 20 monolayers can be grown.

In certain embodiments of semiconductor nanocrystals including a core/shell structure, a core/shell nanocrystal can have an average diameter from, for example, about 3 to about 55 nm, from about 3 to about 40 nm, from about 3 to about 25 nm, from about 3 to about 10 nm, etc. In certain embodiments, the average diameter of a nanocrystal core can be, for example, from about 1 to about 7 nm, from about 1 to about 4 nm, from about 2 to about 3 mm, from about 4 to about 7 nm, etc. An example of an average thickness for a shell is from about 1 to about 3 nm, which corresponds to an approximately 10 monolayer thickness. (In such example, a monolayer thickness would be approximately from about 1 to about 3 Angstroms.) The actual monolayer thickness is dependent upon the size and composition of the molecules included in the shell.

In certain embodiments, a semiconductor nanocrystal further includes one or more ligands attached to the outer surface thereof.

In certain embodiments of the inventions described or contemplated by this general description, the following detailed description, and claims, a plurality of semiconductor nanocrystals is included in a composition.

In certain embodiments, the plurality of semiconductor nanocrystals included in the composition are preferably of a substantially monodisperse, and more preferably, of a monodisperse, size.

In certain embodiments, the composition further includes a polymer.

In certain embodiments, the composition further includes a pre-polymer.

In certain embodiments, the composition further includes an oligomer.

In certain embodiments, the composition further includes a small molecule.

In certain embodiments, the composition further includes an inorganic material.

In further embodiments, the composition comprises a matrix. The matrix can comprise an organic or inorganic material.

In certain embodiments, the matrix includes a plurality of semiconductor nanocrystals dispersed therein. In certain embodiments, the plurality of semiconductor nanocrystals is randomly dispersed in the matrix. In certain embodiments, the plurality of semiconductor nanocrystals is homogeneously dispersed in the matrix.

Non-limiting examples of matrices include, but are not limited to, a polymer (e.g., polystyrene, epoxy, polyimides), a glass (e.g., silica glass), a gel (e.g., a silica gel), and any other material which is at least partially, and preferably fully, transparent to the light emitted by the semiconductor nanocrystals and in which semiconductor nanocrystals can be included. Depending on the use of the composition, the matrix can be conductive or non-conductive. Examples of preferred matrices include, but are not limited to, glass or a resin. Resins can be non-curable resins, heat-curable resins, or photocurable resins. More specific examples of resins can be in the form of either an oligomer or a polymer, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like. Examples of a photo-polymerizable resin include an acrylic acid or methacrylic acid based resin containing a reactive vinyl group, a photo-crosslinkable resin which generally contains a photo-sensitizer, such as polyvinyl cinnamate, or the like. A heat-curable resin may selected when the photo-sensitizer is not used. Matrix resins may be used individually or in combination of two or more. Other matrix materials can be readily identified by one of ordinary skill in the art. In certain embodiments, a composition including a matrix may further include scatterers (e.g, without limitation, metal or metal oxide particles, air bubbles, and glass and polymeric beads (solid or hollow), and/or other optional additives typically used in the desired end-use application for the composition.

In certain embodiments, the composition further includes a liquid medium. In certain embodiments, compositions in accordance with the present invention including a liquid medium comprise an ink. Examples of suitable liquids and other optional additives that may be included in an ink are described in International Application No. PCT/US2007/00873 of Seth Coe-Sullivan et al., for "Composition Including Material, Methods Of Depositing Material, Articles Including Same And Systems For Deposition Material", filed 9 Apr. 2007, and International Application No. PCT/US2007/014711 of Seth Coe-Sullivan et al., for "Methods For Depositing Nanomaterial, Methods For Fabricating A device, And Methods For Fabricating An Array Of Devices", filed 25 Jun. 2007, which are each hereby incorporated herein by reference in their entireties.

In certain embodiments, the composition further includes a non-polar liquid in which the semiconductor nanocrystal is dispersible.

In certain embodiments, the composition further includes a polar liquid in which the semiconductor nanocrystal is dispersible.

In a still further aspect of the invention there is provided a device including semiconductor nanocrystals in accordance with the present invention.

In certain embodiments, a device comprises a layer comprising a plurality of semiconductor nanocrystals and means for exciting the semiconductor nanocrystals.

Examples of semiconductor nanocrystals are described above and in the detailed description.

In certain embodiments, the plurality of semiconductor nanocrystals are preferably of a substantially monodisperse, and more preferably, of a monodisperse, size.

In certain embodiments, means for exciting the semiconductor nanocrystals comprises a light source.

In certain embodiments, means for exciting the semiconductor nanocrystals comprises a first electrode and a second electrode opposed to the first electrode and the layer comprising semiconductor nanocrystals is disposed between the two electrodes and in electrical communication therewith. In certain embodiments, one of the electrodes can be supported by a substrate (which can be flexible or rigid).

In certain embodiments, the device further includes at least one charge transport layer between the two electrodes. In certain embodiments, two charge transport layers are included, e.g., a hole transport layer and an electron transport layer. In certain embodiments, two charge transport layers, e.g., a hole transport layer and an electron transport layer, and a hole blocking layer are included. In certain other embodiments, additional layers can be included. Charge transport materials, hole blocking materials, and other materials that may be included in a device can be identified by a person having ordinary skill in the art. In a device including semiconductor nanocrystals capable of emitting blue light, for example, a hole transport layer comprising 4-4'-N,N'-dicarbazolyl-biphenyl (CBP) and an electron transport layer comprising 2,2',2"-(1,3,5-Benzinetriyl)-tris(1-phenyl-1-H-benzimidazole) (TBPi) can be used. U.S. Provision Patent Application No. 60/825,374, filed 12 Sep. 2006, of Seth A. Coe-Sullivan et al., for "Light-Emitting Devices And Displays With Improved Performance". Additional information concerning devices, device structures, examples of materials for use in various device structures, etc. are discussed in U.S. Provision Patent Application No. 60/825,374, filed 12 Sep. 2006, of Seth A. Coe-Sullivan et al., for "Light-Emitting Devices And Displays With Improved Performance", which is hereby incorporated herein by reference, and elsewhere herein.

In certain embodiments, a device in accordance with the present invention comprises a light-emitting device. In certain other embodiments, a device in accordance with the present invention comprises a display device. In certain other embodiments, a device in accordance with the present invention comprises a solid state lighting device.

For additional information concerning devices, light sources, and compositions see also, for example, U.S. Pat. No. 5,434,878 of Lawandy; U.S. Pat. No. 5,882,779 of Lawandy; U.S. Pat. No. 6,890,777 of Bawendi et al.; U.S. Pat. No. 6,803,719 of Miller et al. Each of the foregoing patents is hereby incorporated herein by reference in its entirety.

Selection of the composition of a semiconductor nanocrystal, as well as the size of the semiconductor nanocrystal, can affect the characteristic spectral emission wavelength of the semiconductor nanocrystal. Thus, as one of ordinary skill in the art will realize, a particular composition of a nanocrystal as listed above will be selected based upon the spectral region desired. For embodiments of semiconductor nanocrystals comprising a core/shell structure, selection of the composition of a semiconductor nanocrystal core and shell, as well as the size of the nanocrystal core and thickness of the shell, can affect the characteristic spectral emission wavelength of the semiconductor nanocrystal. Thus, as one of ordinary skill in the art will realize, a particular composition of a nanocrystal will be selected based upon the spectral region desired. For example, for embodiments including a core/shell structure, for any particular composition selected for inclusion in a semiconductor nanocrystal core contemplated, it is possible to tune the emission to a desired wavelength by controlling the thickness of the shell, based on the band gap of the shell material.

For applications that utilize the luminescent properties of a semiconductor nanocrystal, the semiconductor nanocrystal size is selected such that the nanocrystal exhibits quantum confinement. Such applications include, but are not limited to, light-emitting devices, lasers, biomedical tags, photoelectric devices, solar cells, catalysts, and the like. Light-emitting devices including nanocrystals in accordance with the present invention may be incorporated into a wide variety of consumer products, including, but not limited to, flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control such devices, including passive matrix and active matrix.

An example of a method of manufacturing a semiconductor nanocrystal comprises a colloidal growth process. Colloidal growth occurs by injection of the precursors, e.g., an M donor and an A donor, in the case of a semiconductor nanocrystal or a semiconductor nanocrystal core comprising a first semiconductor material, into a hot coordinating solvent. One example of a method for preparing monodisperse semiconductor nanocrystals comprises pyrolysis of organometallic reagents, such as dimethyl cadmium, injected into a hot, coordinating solvent. This permits discrete nucleation and results in the controlled growth of macroscopic quantities of semiconductor nanocrystals or cores. The injection produces a nucleus that can be grown in a controlled manner to form a semiconductor nanocrystal core. The reaction mixture can be gently heated to grow and anneal the semiconductor nanocrystal or core. Both the average size and the size distribution of the semiconductor nanocrystals or cores in a sample are dependent on the growth temperature. The growth temperature necessary to maintain steady growth increases with increasing average crystal size. The semiconductor nanocrystal or core is a member of a population of semiconductor nanocrystals. As a result of the discrete nucleation and controlled growth, the population of semiconductor nanocrystals or cores that can be obtained has a narrow, monodisperse distribution of diameters. The monodisperse distribution of diameters can also be referred to as a size. Preferably, a monodisperse population of nanocrystals or cores includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5%.

In certain embodiments, the preparation of semiconductor nanocrystals or cores can be carried out in the presence of an amine. See, for example, U.S. Pat. No. 6,576,291 for "Preparation of Nanocrystallites" of Bawendi et al. issued 10 Jun. 2003, which is hereby incorporated herein by reference in its entirety.

The narrow size distribution of the semiconductor nanocrystals (e.g., semiconductor nanocrystals including or not including a core/shell structure) the possibility of light emission in narrow spectral widths. Monodisperse semiconductor nanocrystals have been described in detail in Murray et al. (J. Am. Chem. Soc., 115:8706 (1993)); in thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 for "Highly Luminescent Color-Selective Materials". The foregoing are hereby incorporated herein by reference in their entireties.

The process of controlled growth and annealing of the semiconductor nanocrystals or cores in the coordinating solvent that follows nucleation can also result in uniform surface derivatization and regular structures. As the size distribution sharpens, the temperature can be raised to maintain steady growth. By adding more M donor or A donor, the growth period can be shortened. In certain embodiments, an M donor can comprise, for example, an inorganic compound, an organometallic compound, or elemental metal. In certain embodiments, for example, M can comprise cadmium, zinc, magnesium, mercury, aluminum, gallium, indium, thallium, etc. In certain embodiments, an A donor can comprise a compound capable of reacting with the M donor to form a material with the general formula MA. For example, an A donor can comprise a chalcogenide donor or a pnictide donor, such as elemental form dispersed in a solvent (e.g., Se in octadecene, S in an amine, etc.), a phosphine chalcogenide, a bis(silyl) chalcogenide, dioxygen, an ammonium salt, or a tris(silyl) pnictide. Additional examples of suitable A donors include, but are not limited to, dioxygen, bis(trimethylsilyl)selenide ($(TMS)_2Se$), trialkyl phosphine selenides such as (tri-noctylphosphine)selenide (TOPSe) or (tri-n-butylphosphine)selenide (TBPSe), trialkyl phosphine tellurides such as (tri-n-octylphosphine)telluride (TOPTe) or hexapropylphosphorustriamide telluride (HPPTTe), bis(trimethylsilyl)telluride ($(TMS)_2Te$), bis(trimethylsilyl)sulfide ($(TMS)_2S$), a trialkyl phosphine sulfide such as (tri-noctylphosphine) sulfide (TOPS), an ammonium salt such as an ammonium halide (e.g., $NH_4Cl$), tris(trimethylsilyl)phosphide ($(TMS)_3P$), tris(trimethylsilyl)arsenide ($(TMS)_3As$), or tris(trimethylsilyl)antimonide ($(TMS)_3Sb$). In certain embodiments, the M donor and the A donor can be moieties within the same molecule.

Suitable solvents for use in preparing semiconductor nanocrystals, semiconductor nanocrystal cores, and/or shells include coordinating solvents and non-coordinating solvents. A coordinating solvent can help control the growth of the semiconductor nanocrystal core. A coordinating solvent is a compound having at least one donor site (e.g., lone electron pair) that is available to coordinate to a surface of the growing semiconductor nanocrystal. Solvent coordination can stabilize the growing semiconductor nanocrystal. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the semiconductor nanocrystal production. Other examples include squalene and octadecene. In certain embodiments, a coordinating solvent comprises pyridine, tri-n-octyl phosphine (TOP), tri-n-octyl phosphine oxide (TOPO) and trishydroxylpropylphosphine (tHPP), amines (including, but not limited to, for example, decylamine, hexadecylamine, octadecylamine). Technical grade TOPO can also be used.

Alternatively, a non-coordinating solvent can be used. Examples of suitable non-coordinating solvents include, but are not limited to, squalane, octadecane, and saturated hydrocarbon solvents, Other methods and method variations (e.g., including different solvents, precursors, reaction conditions, etc.) can also be used in preparing semiconductor nanocrystals. Such methods and variations are within the skill of one of ordinary skill in the art.

Size distribution during the growth stage of the reaction can be estimated by monitoring the absorption and/or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals as well as to sharpen size distribution. For example, for ZnS, CdSe, CdTe, PbSe, and InSb, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm. By stopping growth at a particular semiconductor nanocrystal average diameter, a population having an average semiconductor nanocrystal diameter of less than 150 Å can be obtained. A population of nanocrystals can have an average diameter of 15 Å to 125 Å.

The particle size distribution of the semiconductor nanocrystals can be further refined by size selective precipitation with a poor solvent for the semiconductor nanocrystals, such as methanol/butanol as described in U.S. Pat. No. 6,322,901. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest nanocrystals in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected semiconductor nanocrystal population preferably has no more than a 15% rms deviation from mean diameter, more preferably 10% rms deviation or less, and most preferably 5% rms deviation or less.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

An example of a process for forming a shell over at least a portion of a core is described, for example, in U.S. Pat. No. 6,322,901, incorporated herein by reference in its entirety. By adjusting the temperature of the reaction mixture during overcoating and monitoring the absorption spectrum of the core, over coated materials having high emission quantum efficiencies and narrow size distributions can be obtained. Alternatively, a shell can be formed by exposing a core nanocrystal having a first composition and first average diameter to a population of nanocrystals having a second composition and a second average diameter smaller than the first average diameter.

Overcoating is preferably carried out in a liquid medium. In certain embodiments, the liquid medium comprises a coordinating solvent. Suitable coordinating solvents include any coordinating solvent that can be used in preparation of nanocrystal cores. In certain embodiments, the nanocrystal cores are dispersed in the coordinating solvent. In certain other embodiments, the nanocrystal cores are colloidally dispersed in the coordinating solvent during at least part of the overcoating process. In certain other embodiments, the liquid medium can comprise a non-coordinating solvent.

In embodiments wherein a semiconductor nanocrystal comprises a core/shell structure, shell thickness can be varied by growing a desired thickness of the shell. For example, the shell can have a thickness less than about one monolayer, about one monolayer, or more than about one monolayer. The thickness is selected to achieve the predetermined characteristics of the core/shell nanocrystal. For example, in certain embodiments, the shell thickness can be at least about one monolayer. Preferably, the thickness is less than that at which quantum confinement is not achieved. In certain embodiments, the thickness is in a range from greater than 0 to about 20 monolayers. In certain embodiments, the thickness is in a range from greater than 0 to about 10 monolayers. In certain embodiments, the thickness is in a range from greater than 0 to about 5 monolayers. In certain embodiments, the thickness is in a range from about 1 to about 5 monolayers. In certain embodiments, the thickness is in a range from about 3 to about 5 monolayers. In certain embodiments, more than 20 monolayers can be grown.

As discussed above, in certain embodiments, more than one shell can be included over a core.

By selecting and adjusting the temperature of the reaction mixture during overcoating and monitoring the absorption spectrum of the core, overcoated materials having high emission quantum efficiencies and narrow size distributions can be obtained. The selection and adjustment is within the skill of one of ordinary skill in the art.

In certain embodiments, the band gap of the shell material is greater than that of the core. In certain other embodiments, the band gap of the shell material is less than that of the core.

In certain embodiments, the shell is disposed over, for example, at least 60%, at least 70%, at least 80%, at least 90% of the nanocrystal core. In certain preferred embodiment, the nanocrystal core is substantially completely (e.g., greater than 95%, greater than 96%, greater than 97%, greater than 98%, greater than 99%) overcoated with the shell.

Precursors for a second semiconductor material included in the shell can be in any form that is suitable for the generation of the shell. Such forms are known to or can be determined by the skilled person. Examples of the numerous suitable precursors for M' comprising cadmium and zinc include organometallic compounds, for example, alkylated compounds such an dimethylzinc ($ZnMe_2$), diethylzinc ($ZnEt_2$), dimethylcadmium ($CdMe_2$), or as salts or long chain alkyl carboxylic acid derivatives such as cadmium stearate. Examples of suitable precursors for A' comprising sulfur include bis(trimethylsilyl)sulfide (($TMS)_2S$) (also referred to as hexamethyldisilathiane), elemental sulfur, etc. Precursors can be synthesized and used as stock solutions or made in situ. Examples of suitable precursor molecules of Cd, Zn, and S and the preparation thereof, are described in Murray et al., supra; Cao and Banin, J. Am. Chem. Soc. 122, pages 9692 9702, (2000); Peng et al, supra, Dabboussi et al, J. Phys. Chem. B., 101, pages 9643 9475, (1997), or U.S. Pat. No. 6,322,901 for instance, the contents of all of which are hereby incorporated by reference.

In certain embodiments of forming a shell over a core, semiconductor nanocrystal cores, a liquid medium, and any optional additives are heated to a temperature between 100-360° C. prior to the addition of any shell precursors. Preferably the mixture is heated to a temperature of 170° C. In one embodiment the mixture is kept at a temperature of approximately 170° C. for between 5 minutes and 2 hours after addition of the precursors, preferably the mixture is kept at a temperature of 170° C. for 10 minutes after addition of the precursors.

A wealth of suitable high boiling point liquids exist that can be used as coordinating solvents in the preparation of a shell. Among the different types of high boiling point liquids that can be used are alkyl phosphine/phosphine oxide/phosphite/phosphate/amine/phosphonic acid/ether/alkane, etc.

Specific examples of suitable liquids and liquid mixtures that are suitable for use as coordinating solvents include but are not limited to trioctylphosphine, tributylphosphine, tri(dodecyl)phosphine, trioctylphosphine oxide, dibutyl-phosphite, tributyl phosphite, trioctadecyl phosphite, trilauryl phosphite, tris(tridecyl)phosphite, triisodecyl phosphite, bis(2-ethylhexyl)phosphate, tris(tridecyl)phosphate, hexadecylamine, oleylamine, octadecylamine, bis(2-ethylhexyl) amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. Other examples include squalene and octadecene.

Examples of suitable non-coordinating solvents include, but are not limited to, squalane, octadecane, and saturated hydrocarbon solvents.

Optionally, an amine can be further admixed with the nanocrystal cores and liquid medium prior to addition of the shell pre-cursors.

Examples of amines include, but are not limited to, primary alkyl amine or a primary alkenyl amine, such as a $C_2$-$C_{20}$ alkyl amine, a $C_2$-$C_{20}$ alkenyl amine, preferably a $C_8$-$C_{18}$ alkyl amine or a $C_8$-$C_{18}$ alkenyl amine. A preferred amine is decylamine.

The presence of amine in the liquid medium, whether in preparing semiconductor nanocrystal, a semiconductor nanocrystal core and/or a shell, can contribute to the quality of the semiconductor nanocrystal obtained from an M or M' donor (e.g., an M or M'-containing salt) and A or A' donor. In certain embodiments, the solvent comprises alkyl phosphine oxide and includes an amine, wherein the amine and an alkyl phosphine oxide are present in a mole ratio of, for example 10:90, 30:70, or 50:50. A combined amine and solvent mixture can decrease size dispersion and can improve photoluminescence quantum yield of the semiconductor nanocrystal. For example, suitable amines for combining with tri-octylphosphine oxide (TOPO) include 1-hexadecylamine, or oleylamine. When the 1,2-diol or aldehyde and the amine are used in combination with the M-containing salt to form a population of semiconductor nanocrystals, the photoluminescence quantum efficiency and the distribution of semiconductor nanocrystal sizes can be improved in comparison to semiconductor nanocrystals manufactured without the 1,2-diol or aldehyde or the amine.

It is understood that the invention contemplates a semiconductor nanocrystal including all sizes and shapes of semiconductor nanocrystals, semiconductor nanocrystal cores, and core/shell structures.

In certain preferred embodiments, a semiconductor nanocrystal in accordance with the present invention can include at least one ligand attached thereto. Preferably, a ligand comprises an organic material. A ligand may be any number of materials, but has an affinity for the semiconductor nanocrystal surface. For example, a ligand can be an isolated organic molecule, a polymer (or a monomer for a polymerization reaction), an inorganic complex, and an extended crystalline structure. A ligand can be used to enhance the functionality, binding properties, dispersibility of a coated semiconductor nanocrystal homogeneously into a chosen medium, functionality, binding properties, or the like. In addition, a ligand can be used to tailor the optical properties of the semiconductor nanocrystal.

In certain embodiments, the ligands can be derived from the solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce nanocrystals which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

The organic ligands can be useful in facilitating large area, non-epitaxial deposition of highly stable inorganic nanocrystals within a device.

More specifically, the coordinating ligand can have the formula:

$$(Y-)_{k-n}-(X)-(-L)_n$$

wherein k is 2, 3 4, or 5, and n is 1, 2, 3, 4 or 5 such that k-n is not less than zero; X is O, O—S, O—Se, O—N, O—P, O—As, S, S═O, SO2, Se, Se═O, N, N═O, P, P═O, C═O As, or As═O; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

Monodentate alkyl phosphines (and phosphine oxides, the term phosphine in the following discussion of ligands will refer to both) can passivate nanocrystals efficiently. When nanocrystals with conventional monodentate ligands are diluted or embedded in a non-passivating environment (i.e. one where no excess ligands are present), they can lose their high luminescence and their initial chemical inertness. Typical are an abrupt decay of luminescence, aggregation, and/or phase separation. In order to overcome these possible limitations, polydentate ligands can be used, such as a family of polydentate oligomerized phosphine ligands. The polydentate ligands show a high affinity between ligand and nanocrystal surface. In other words, they are stronger ligands, as is expected from the chelate effect of their polydentate characteristics.

Oligomeric phosphines have more than one binding site to the nanocrystal surface, which ensures their high affinity to the nanocrystal surface. See, for example, for example, U.S. Ser. No. 10/641,292, filed Aug. 15, 2003, and U.S. Ser. No. 60/403,367, filed Aug. 15, 2002, each of which is incorporated by reference in its entirety. The oligomeric phosphine can be formed from a monomeric, polyfunctional phosphine, such as, for example, trishydroxypropylphosphine, and a polyfunctional oligomerization reagent, such as, for example, a diisocyanate. The oligomeric phosphine can be contacted with an isocyanate of formula R'-L-NCO, wherein L is $C_2$-$C_{24}$ alkylene, and R' has the formula

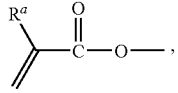

R' has the formula

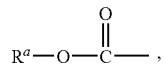

wherein $R^a$ is hydrogen or $C_1$-$C_4$ alkyl, or R' is hydrogen.

A suitable coordinating ligand can be purchased commercially or prepared by ordinary synthetic organic techniques, for example, as described in J. March, Advanced Organic Chemistry, which is hereby incorporated by reference in its entirety.

Other ligands are described in U.S. patent application Ser. No. 10/641,292 for "Stabilized Semiconductor Nanocrystals", filed 15 Aug. 2003, which is hereby incorporated herein by reference in its entirety.

EXAMPLES

The examples provided herein are provided as examples and not limitations, wherein a number of modifications of the exemplified compositions and processes are contemplated and within the scope of the present invention.

Unless otherwise specified, the following core preparations and manipulations and shell preparations and manipulations were carried out in a nitrogen atmosphere in a glove box.

Example 1A

Core Preparation 0.026 g CdO (99.998% purity—Alfa) and 0.043 g of ZnO (99.999% purity—Sigma Aldrich) were weighed into a three necked flask equipped with a condenser. To this was added: 2 ml tech grade oleic acid (Aldrich) and 16 ml of tech grade octadecene (ODE) (Aldrich). The contents of the flask were degassed at 80° C. for 20 minutes in vacuo (200 millitorr).

Separately 0.038 g of sulfur (99.999% Strem) was dissolved in 10 ml of tech grade ODE in a septum capped vial by stirring and heating in an oil bath to 130° C. While the sample was heating up, the pressure of the vessel was reduced to 200 millitorr until the oil bath temperature was 85° C., then further heating was continued under nitrogen. After 1 hour, when all the sulfur was dissolved, the sample was cooled to room temperature.

The contents of the three necked flask were stirred and heated to 310° C. under nitrogen until all the oxides dissolved to give a clear solution. The temperature controller was then set to 300° C. and once the temperature stabilized at 300° C., approximately 4.4 ml of S in ODE was rapidly injected. The temperature of the solution fell to about 270° C. and climbed back to 300° C. in ~30 minutes. The reaction was stopped after 3 hours and the contents of the flask were transferred to a degassed vial under nitrogen and transferred to an inert atmosphere box for further purification.

The cores were purified by precipitation as follows. (In this example, the precipitation step was carried out two times for each sample.) The solution was divided in half; each half was added to a separate centrifuge tube. Excess butanol (~20-30 ml) was added to each centrifuge tube. Each tube was then centrifuged for 5 min, 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. After mixing, each centrifuge tube was centrifuged again. The supernatant liquid from each centrifuge tube was transferred to a separate clean tube; the solids in each centrifuge tube were discarded. Cores were precipitated from the supernatant liquid in each of the separate tubes by adding excess butanol (20-25 ml) with stirring. The new tubes containing the precipitated cores were centrifuged, the supernatant liquid decanted, leaving precipitated cores in each tube. ~5-6 ml anhydrous hexane were added to the precipitated cores in each tube to solvate the cores and the contents of each tube was filtered through a 0.2 micron filter. (The cores are in the filtrate.)

A 2.5 µl aliquot of the filtrate was diluted 100 fold with anhydrous hexane and a UV VIS spectrum of the diluted aliquot was measured and absorbance at 350 nm measured. Characterization of the Cores:—First Peak 437 Nm, abs=0.057, at 350 Nm, abs=0.344 maximum peak emission—445 nm
FWHM=15 nm
Photoluminescence quantum efficiency ~31%

Example 1B

Shell Preparation (ZnS)

5 ml of 97% trioctylphosphine and 5 ml of oleylamine (distilled prior to use), were placed in a 4 necked flask equipped with a condenser and thermocouple. The sample was stirred and degassed at 100° C. for ~1 hour. After introducing $N_2$ to the flask and reducing the temperature to 80° C., 4.2 ml of hexane containing core (see Example 1A above) was added and the solvent removed under vacuo for 2 hours. The temperature was raised to 170° C. and bis-trimethylsilyl-sulfide (137 mg) in 4 ml of TOP and diethylzinc (47.4 mg) in 4 ml of TOP were added from separate syringes at a rate of 50 microliters/minute. The solution in the flask was observed to develop a bluish color. After addition was complete, the solution looked cloudy. The sample was transferred via a degassed vial into an inert atmosphere box.

The cores including a ZnS shell were purified by precipitation as follows. (In this example, the precipitation step was carried out two times for each sample.) were purified as follows. The solution was divided into 2 centrifuge tubes. Excess butanol (~20-30 ml) was added to each centrifuge tube. The centrifuge tubes were centrifuged for 5 minutes at 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. Semiconductor nanocrystals comprising a core and a ZnS shell disposed over the core were precipitated by adding excess butanol (20-25 ml) with stirring. The centrifuge tube contents were centrifuged. The supernatant liquid was decanted, leaving the semiconductor nanocrystals in the centrifuge tubes. ~5 ml anhydrous hexane were added to the semiconductor nanocrystals in one of the centrifuge tubes to solvate the semiconductor nanocrystals. The hexane including the solvated semiconductor nanocrystals was then transferred into the second centrifuge tube to solvate the semiconductor nanocrystals contained therein. The mixture including the hexane and the semiconductor nanocrystals from both centrifuge tubes was filtered through a 0.2 micron filter. (The Overcoated Cores are in the Filtrate.)

Characterization of the Core/Shell Nanocrystals:
maximum peak emission—446 nm
FWHM 17 nm
Photoluminescence quantum efficiency ~100%

Example 2A

Core Preparation 0.025 g CdO (99.998% Alfa) and 0.035 g of ZnO (99.999% Sigma Aldrich) were weighed into a three necked flask equipped with a condenser. To this was added: 2 ml tech grade oleic acid (Aldrich) and 16 ml of tech grade octadecene (ODE) (Aldrich). The contents of the flask were degassed at 80° C. for 20 minutes in vacuo (200 millitorr).

Separately 0.035 g of sulfur (99.999% Strem) was dissolved in 10 ml of tech grade ODE in a septum capped vial by stirring and heating in an oil bath to 130° C. While the sample was heating up, the pressure of the vessel was reduced to 200 millitorr until the oil bath temperature was 85° C., then further heating was continued under nitrogen. After 1 hour, when all the sulfur was dissolved, the sample was cooled to room temperature.

The contents of the three necked flask were stirred and heated to 310° C. under nitrogen until all the oxides dissolved to give a clear solution. The temperature controller was then set to 300° C. and once the temperature stabilized at 300° C., approximately 4.0 ml of S in ODE was rapidly injected. The temperature of the solution fell to about 270° C. and climbed back to 300° C. in ~30 minutes. The reaction was stopped after 4 hours and the contents of the flask were transferred to a degassed vial under nitrogen and transferred to an inert atmosphere box for further purification.

The cores were purified by precipitation as follows. (In this example, the precipitation step was carried out two times for each sample.) The solution was divided in half; each half was added to a separate centrifuge tube. Excess butanol (~20-30 ml) was added to each centrifuge tube. Each tube was then centrifuged for 5 min, 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. After mixing, each centrifuge tube was centrifuged again. The supernatant liquid from each centrifuge tube was transferred to a separate clean tube; the solids in each centrifuge tube were discarded. Cores were precipitated from the supernatant liquid in each of the separate tubes by adding excess butanol (20-25 ml) with stirring. The new tubes containing the precipitated cores were centrifuged, the supernatant liquid decanted, leaving precipitated cores in each tube. ~5-6 ml anhydrous hexane were added to the precipitated cores in each tube to solvate the cores and the contents of each tube was filtered through a 0.2 micron filter. (The cores are in the filtrate.)

A 2.5 µl aliquot of the filtrate was diluted 100 fold with anhydrous hexane and a UV VIS spectrum of the diluted aliquot was measured and absorbance at 350 nm measured. Characterization of the Cores:—First Peak 457 Nm, abs=0.081, at 350 nm, abs=0.469 maximum peak emission—461 nm
FWHM 15 nm
Photoluminescence quantum efficiency ~22%

Example 2B

Shell Preparation (ZnS)

5 ml of 97% trioctylphosphine and 5 ml of oleylamine (distilled prior to use), were placed in a 4 necked flask equipped with a condenser and thermocouple. The sample was stirred and degassed at 100° C. for ~1 hour. After introducing $N_2$ to the flask and reducing the temperature to 80° C., 3.5 ml of hexane containing cores (see Example 1A above) was added and the solvent removed under vacuo for 2 hours. The temperature was raised to 170° C. and bis-trimethylsilyl-sulfide (79.6 mg) in 4 ml of TOP and diethylzinc (27.6 mg) in 4 ml of TOP were added from separate syringes at a rate of 50 microliters/minute. The solution in the flask was observed to develop a bluish color. After addition was complete, the solution looked cloudy. The sample was transferred via a degassed vial into an inert atmosphere box.

The cores including a ZnS shell were purified by precipitation as follows. (In this example, the precipitation step was carried out two times for each sample.) The solution was divided into 2 centrifuge tubes. Excess butanol (~20-30 ml) was added to each centrifuge tube. The centrifuge tubes were centrifuged for 5 minutes at 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. Semiconductor nanocrystals comprising a core and a ZnS shell disposed over the core were precipitated by adding excess butanol (20-25 ml) with stirring. The centrifuge tube contents were centrifuged. The supernatant liquid was decanted, leaving the semiconductor nanocrystals in the centrifuge tubes. ~5 ml anhydrous hexane were added to the semiconductor nanocrystals in one of the centrifuge tubes to solvate the semiconductor nanocrystals. The hexane including the solvated semiconductor nanocrystals was then transferred into the second centrifuge tube to solvate the semiconductor nanocrystals contained therein. The mixture including the hexane and the semiconductor nanocrystals from both centrifuge tubes was filtered through a 0.2 micron filter. (The overcoated cores are in the filtrate.)
Characterization of the Core/Shell Nanocrystals:
    maximum peak emission—464 nm
    FWHM 17 nm
    Photoluminescence quantum efficiency ~74%

Example 3A

Core Preparation 0.025 g CdO (99.998% purity Aldrich) and 0.033 g of ZnO (99.998% Sigma Aldrich) were weighed into a three necked flask equipped with a condenser. To this was added: 2 ml tech grade oleic acid (Aldrich) and 16 ml of tech grade octadecene (ODE) (Aldrich). The contents of the flask were degassed at 80° C. for 20 minutes in vacuo (200 millitorr).

Separately 0.032 g of sulfur (99.999% Strem) was dissolved in 10 ml of tech grade ODE in a septum capped vial by stirring and heating in an oil bath to 130° C. While the sample was heating up, the pressure of the vessel was reduced to 200 millitorr until the oil bath temperature was 85° C., then further heating was continued under nitrogen. After 1 hour, when all the sulfur was dissolved, the sample was cooled to room temperature.

The contents of the three necked flask were stirred and heated to 310° C. under nitrogen until all the oxides dissolved to give a clear solution. The temperature controller was then set to 300° C. and once the temperature stabilized at 300° C., approximately 4.0 ml of S in ODE was rapidly injected. The temperature of the solution fell to about 270° C. and climbed back to 300° C. in ~30 minutes. The reaction was stopped after 4 hours and the contents of the flask were transferred to a degassed vial under nitrogen and transferred to an inert atmosphere box for further purification.

The cores were purified by precipitation as follows. (In this example, the precipitation step was carried out two times for each sample.) The solution was divided in half, each half was added to a separate centrifuge tube. Excess butanol (~20-30 ml) was added to each centrifuge tube. Each tube was then centrifuged for 5 min, 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. After mixing, each centrifuge tube was centrifuged again. The supernatant liquid from each centrifuge tube was transferred to a separate clean tube; the solids in each centrifuge tube were discarded. Cores were precipitated from the supernatant liquid in each of the separate tubes by adding excess butanol (20-25 ml) with stirring. The new tubes containing the precipitated cores were centrifuged, the supernatant liquid decanted, leaving precipitated cores in each tube. ~5-6 ml anhydrous hexane were added to the precipitated cores in each tube to solvate the cores and the contents of each tube was filtered through a 0.2 micron filter. (The cores are in the filtrate.)

A 2.5 µl aliquot of the filtrate was diluted 100 fold with anhydrous hexane and a UV VIS spectrum of the diluted aliquot was measured and absorbance at 350 nm measured. Characterization of the Cores:—First Peak 460 Nm, abs=0.0267, at 350 nm, abs=0.176
    maximum peak emission—466 nm
    FWHM 15 nm
    Photoluminescence quantum efficiency 20%

Example 3B

Shell Preparation (ZnS)

5 ml of 97% trioctylphosphine and 5 ml of oleylamine (distilled prior to use), were placed in a 4 necked flask equipped with a condenser and thermocouple. The sample was stirred and degassed at 100° C. for ~1 hour. After introducing $N_2$ to the flask and reducing the temperature to 80° C., 4.5 ml of hexane containing core (see Example 1A above) was added and the solvent removed under vacuo for 2 hours. The temperature was raised to 170° C. and bis-trimethylsilyl-sulfide (49.6 mg) in 4 ml of TOP and diethylzinc (17.2 mg) in 4 ml of TOP were added from separate syringes at a rate of 50 microliters/minute. The solution in the flask was observed to develop a bluish color. After addition was complete, the solution looked cloudy. The sample was transferred via a degassed vial into an inert atmosphere box.

The cores including a ZnS shell were purified by precipitation as follows. (In this example, the precipitation step was carried out two times for each sample.) The solution was divided into 2 centrifuge tubes. Excess butanol (~20-30 ml) was added to each centrifuge tube. The centrifuge tubes were centrifuged for 5 minutes at 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. Semiconductor nanocrystals comprising a core and a ZnS shell disposed over the core were precipitated by adding excess butanol (20-25 ml) with stirring. The centrifuge tube contents were centrifuged. The supernatant liquid was decanted, leaving the semiconductor nanocrystals in the centrifuge tubes. ~5 ml anhydrous hexane were added to the semiconductor nanocrystals in one of the centrifuge tubes to solvate the semiconductor nanocrystals. The hexane including the solvated semiconductor nanocrystals was then transferred into the second centrifuge tube to solvate the semiconductor nanocrystals contained therein. The mixture including the hexane and the semiconductor nanocrystals from both centrifuge tubes was filtered through a 0.2 micron filter. (The overcoated cores are in the filtrate.)
Characterization of the Core/Shell Nanocrystals:
    maximum peak emission—470 nm
    FWHM 17 nm
    Photoluminescence quantum efficiency ~59%

Example 4A

Core Preparation 0.025 g CdO (99.998% Alfa) and 0.035 g of ZnO (99.999% Sigma Aldrich) were weighed into a three necked flask equipped with a condenser. To this was added: 2 ml tech grade oleic acid (Aldrich) and 16 ml of tech grade octadecene (ODE) (Aldrich). The content of the flask was degassed at 80° C. for 20 minutes in vacuo (200 millitorr).

Separately 0.035 g of sulfur (99.999% Strem) was dissolved in 10 ml of tech grade ODE in a septum capped vial by stirring and heating in an oil bath to 130° C. While the sample was heating up, the pressure of the vessel was reduced to 200 millitorr until the oil bath temperature was 85° C., then further heating was continued under nitrogen. After 1 hour, when all the sulfur was dissolved, the sample was cooled to room temperature.

The contents of the three necked flask were stirred and heated to 310° C. under nitrogen until all the oxides dissolved to give a clear solution. The temperature controller was then set to 300° C. and once the temperature stabilized at 300° C., approximately 4.0 ml of S in ODE was rapidly injected. The temperature of the solution fell to about 270° C. and climbed back to 300° C. in ~30 minutes. The reaction was stopped after 4 hours and the contents of the flask were transferred to a degassed vial under nitrogen and transferred to an inert atmosphere box for further purification.

The cores were purified by precipitation as follows. (In this example, the precipitation step was carried out two times for each sample.) The solution was divided in half; each half was added to a separate centrifuge tube. Excess butanol (~20-30 ml) was added to each centrifuge tube. Each tube was then centrifuged for 5 min, 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. After mixing, each centrifuge tube was centrifuged again. The supernatant liquid from each centrifuge tube was transferred to a separate clean tube; the solids in each centrifuge tube were discarded. Cores were precipitated from the supernatant liquid in each of the separate tubes by adding excess butanol (20-25 ml) with stirring. The new tubes containing the precipitated cores were centrifuged, the supernatant liquid decanted, leaving precipitated cores in each tube. ~5-6 ml anhydrous hexane was added to the precipitated cores in each tube to solvate the cores and the contents of each tube was filtered through a 0.2 micron filter. (The cores are in the filtrate.)

A 2.5 μl aliquot of the filtrate was diluted 100 fold with anhydrous hexane and a UV VIS spectrum of the diluted aliquot was measured and absorbance at 350 nm measured. Characterization of the Cores:—First Peak 454 nm, abs=0.11, at 350 Nm, abs=0.652
    maximum peak emission—459 nm
    FWHM 16 nm
    Photoluminescence quantum efficiency ~28%

Example 4B

Shell Preparation (ZnS)

5 ml of 97% trioctylphosphine and 5 ml of oleylamine (distilled prior to use), were placed in a 4 necked flask equipped with a condenser and thermocouple. The sample was stirred and degassed at 100° C. for ~1 hour. After introducing N2 to the flask and reducing the temperature to 80° C., 2.4 ml of hexane containing core (see example 1 above) was added and the solvent removed under vacuo for 2 hours. The temperature was raised to 170° C. and bis-trimethylsilylsulfide (106.5 mg) in 4 ml of TOP and diethylzinc (36.8 mg) in 4 ml of TOP were added from separate syringes at 50 microliters/minute. The solution in the flask was observed to develop a bluish color and after addition was complete the solution looked cloudy. The sample was transferred via a degassed vial into an inert atmosphere box.

The cores including a ZnS shell were purified by precipitation as follows. (In this example, the precipitation step was carried out two times for each sample.) The solution was divided into 2 centrifuge tubes. Excess butanol (~20-30 ml) was added to each centrifuge tube. The centrifuge tubes were centrifuged for 5 minutes at 4000 rpm. After centrifuging, the supernatant liquid was poured off, retaining the solid in each centrifuge tube. ~5 ml of hexane was added to the solid in each centrifuge tube and the contents of each centrifuge tube were mixed using a vortexer. Semiconductor nanocrystals comprising a core and a ZnS shell disposed over the core were precipitated by adding excess butanol (20-25 ml) with stirring. The centrifuge tube contents were centrifuged. The supernatant liquid was decanted, leaving the semiconductor nanocrystals in the centrifuge tubes. ~5 ml anhydrous hexane were added to the semiconductor nanocrystals in one of the centrifuge tubes to solvate the semiconductor nanocrystals. The hexane including the solvated semiconductor nanocrystals was then transferred into the second centrifuge tube to solvate the semiconductor nanocrystals contained therein. The mixture including the hexane and the semiconductor nanocrystals from both centrifuge tubes was filtered through a 0.2 micron filter. (The overcoated cores are in the filtrate.)
Characterization of the Core/Shell Nanocrystals:
    maximum peak emission—462 nm
    FWHM 18 nm
    Photoluminescence quantum efficiency ~67%

Example 5A

Core Preparation 0.050 g CdO (99.998% purity—Alfa) and 0.066 g of ZnO (99.999% purity—Sigma Aldrich) were weighed into a three necked flask equipped with a condenser. To this was added: 4 ml tech grade oleic acid (Aldrich) and 32 ml of tech grade octadecene (ODE) (Aldrich). The contents of the flask were degassed at 80° C. for 20 minutes in vacuo (200 millitorr).

Separately 0.035 g of sulfur (99.999% Strem) was dissolved in 10 ml of tech grade ODE in a septum capped vial by stirring and heating in an oil bath to 130° C. While the sample was heating up, the pressure of the vessel was reduced to 200 millitorr until the oil bath temperature was 85° C., then further heating was continued under nitrogen. After 1 hour, when all the sulfur was dissolved, the sample was cooled to room temperature.

The contents of the three necked flask were stirred and heated, under nitrogen, to 290° C. for 20 minutes then to 310° C., until all the oxides dissolved to give a clear solution. The temperature controller was then set to 300° C. and once the temperature stabilized at 300° C., approximately 8.0 ml of S in ODE was rapidly injected. The temperature of the solution fell to about 270° C. and climbed back to 300° C. in ~30 minutes. The reaction was stopped after 5 hours and the contents of the flask were transferred to a degassed vial under nitrogen and transferred to an inert atmosphere box for further purification.

The cores were purified by precipitation as follows. The solution was centrifuged for 5 min, 4000 rpm. After centrifuging, the supernatant liquid was poured off, retaining the solid in the centrifuge tube. ~10 ml methanol was added to the tube and then decanted. ~10 ml of anhydrous hexane was thereafter added to the solid in the centrifuge tube and the contents of the tube were mixed using a vortexer. After mixing, the contents of the tube were centrifuged. The supernatant liquid was transferred to a separate clean tube; the solids in the tube after centrifuging were discarded. Cores were precipitated from the supernatant liquid by adding excess butanol (20-25 ml) with stirring. The tube containing the precipitated cores was centrifuged, the supernatant liquid decanted, leaving precipitated cores in the tube. ~7.5 ml anhydrous hexane were added to the precipitated cores to solvate the cores and the contents of the tube were filtered through a 0.2 micron filter. (The cores are in the filtrate.)

A 2.5 µl aliquot of the filtrate was diluted 100 fold with anhydrous hexane and a UV VIS spectrum of the diluted aliquot was measured and absorbance at 350 nm measured.
Characterization of the Cores:
maximum peak emission—461 nm
FWHM=14 nm
Photoluminescence quantum efficiency=~17%

Example 5B

Shell Preparation (ZnS)

5 ml of 97% trioctylphosphine and 5 ml of oleylamine (distilled prior to use), were placed in a 4 necked flask equipped with a condenser and thermocouple. The sample was stirred and degassed at 100° C. for ~1 hour. After introducing $N_2$ to the flask and reducing the temperature to 80° C., 3.8 ml of anhydrous hexane containing cores (see Example 5A above) was added and the solvent removed under vacuo for 2 hours. The temperature was raised to 170° C. and bis-trimethylsilylsulfide (92.53 mg) in 4 ml of TOP and diethylzinc (32.00 mg) in 4 ml of TOP were added from separate syringes at a rate of 50 microliters/minute. The solution in the flask was observed to develop a bluish color. After addition was complete, the solution looked cloudy. The sample was transferred via a degassed vial into an inert atmosphere box.

The cores including a ZnS shell were purified by precipitation as follows. The sample was transferred to Tube 1 and centrifuged for 5 minutes at 4000 rpm. Tube 1 (Batch 1):

After centrifuging, the supernatant liquid was poured off into Tube 2, retaining the solid in Tube 1. ~5 ml of anhydrous hexane was added to the solid in centrifuge Tube 1 and the contents were mixed using a vortexer. Semiconductor nanocrystals comprising a core and a ZnS shell disposed over the core were precipitated by adding excess butanol (20-25 ml) with stirring. The Tube 1 contents were centrifuged. The supernatant liquid was decanted, leaving the semiconductor nanocrystals in the centrifuge tubes. ~3 ml anhydrous hexane were added to the semiconductor nanocrystals in Tube 1 to solvate the semiconductor nanocrystals. The mixture including the anhydrous hexane and the semiconductor nanocrystals from centrifuge tube 1 was filtered through a 0.2 micron filter. (The overcoated cores are in the filtrate.)

Tube 2 (Batch 2):
Excess butanol (~20-30 ml) was added to Tube 2. Tube 2 was centrifuged for 5 minutes at 4000 rpm. After centrifuging, the supernatant liquid was poured off, retaining the solid in the centrifuge tube. ~5 ml of anhydrous hexane was added to the solid in each centrifuge tube and the contents of each centrifuge tube were mixed using a vortexer. Semiconductor nanocrystals comprising a core and a ZnS shell disposed over the core were precipitated by adding excess butanol (20-25 ml) with stirring. The centrifuge tube contents were centrifuged. The supernatant liquid was decanted, leaving the semiconductor nanocrystals in the centrifuge tubes. ~3 ml anhydrous hexane were added to the semiconductor nanocrystals in one of the centrifuge tubes to solvate the semiconductor nanocrystals. The mixture including the anhydrous hexane and the semiconductor nanocrystals from both centrifuge tubes was filtered through a 0.2 micron filter. (The overcoated cores are in the filtrate.)
Characterization of the Core/Shell Nanocrystals:
maximum peak emission 463 nm
FWHM=18 nm
Photoluminescence quantum efficiency ~100%—(Batches 1 & 2)

Example 5C

Shell Preparation in TOPO 5 grams of 99% trioctylphosphine oxide and 5 ml of oleylamine (distilled prior to use), were placed in a 4 necked flask equipped with a condenser and thermocouple. The sample was stirred and degassed at 100° C. for ~1 hour. After introducing $N_2$ to the flask and reducing the temperature to 80° C., 3.8 ml of anhydrous hexane containing cores (see Example 5A above) was added and the solvent removed under vacuo for 2 hours. The temperature was raised to 170° C. and bis-trimethylsilylsulfide (92.53 mg) in 4 ml of TOP and diethylzinc (32.00 mg) in 4 ml of TOP were added from separate syringes at a rate of 50 microliters/minute. The solution in the flask was observed to develop a yellow-green color. After addition was complete, the solution looked cloudy. The sample was transferred via a degassed vial into an inert atmosphere box.

The cores including a ZnS shell prepared in TOPO were purified by precipitation as follows. (In this example, the precipitation step was carried out two times for each sample) as follows. ~5 ml of anhydrous hexane was added to the solid in the degassed vial and 5 ml of solution was added to each of two tubes. Semiconductor nanocrystals comprising a core and a ZnS shell disposed over the core were precipitated by adding 20 ml of a 3:1 anhydrous methanol/isopropanol mixture to each of the two tubes, following which the supernatant liquid was decanted, leaving the semiconductor nanocrystals in the centrifuge tubes. ~3 ml anhydrous hexane were added to the semiconductor nanocrystals in each of the centrifuge tubes to solvate the semiconductor nanocrystals, which were then re-precipitated by the addition of 5 ml of a 3:1 anhydrous methanol/isopropanol mixture. The re-precipitated semiconductor nanocrystals were centrifuged to separate and recover the nanocrystals. After the supernatant liquid was removed, the nanocrystals were solvated in 3 ml anhydrous hexane. The mixture including the anhydrous hexane and the semiconductor nanocrystals from both centrifuge tubes was filtered through a 0.2 micron filter. (The overcoated cores are in the filtrate.)
Characterization of the Core/Shell Nanocrystals:
maximum peak emission 464 nm
FWHM=18
Photoluminescence quantum efficiency 79%

The $Zn_xCd_{1-x}S$ cores prepared in Examples 1A, 2A, and 3A demonstrate a maximum peak emission at a wavelength in a range from about 433 to about 478 nm and a FWHM in a range from about 14 to about 18 nm. The photoluminescence quantum efficiencies for the cores prepared in Examples 1A, 2A, and 3A (under nitrogen varied) range from about 20% to about 40%. For these core samples, the measured photoluminescence quantum yield increased with zinc content. Additionally, the maximum peak emission demonstrated a blue shift as more zinc was incorporated in the core. This is consistent with an alloyed composition.

After overcoating the cores with ZnS by a suitable overcoating process (such as, for example, that described above), the photoluminescence quantum efficiency of the ZnS treated cores increased from about 20-50% (for the cores alone) to from about 59 to about 100%.

The ZnS treated cores are believed to have a core/shell structure based on the observation of a red shift of the maximum peak emission of the ZnS treated cores compared to the cores that have not undergone the overcoating process.

Example 1-5

Determination of Photoluminescence Quantum Efficiency (PLQE)

Diphenyl anthracene (DPA) was used to prepare standards of various concentrations by dissolving DPA in cyclohexane in amounts appropriate to prepare the desired concentrations. The absorbance of each of the standards was measured at 373 nm, and the emission area was measured after excitation at 373 nm. For example, a series of standards of varying concentrations were prepared as described above and the following absorbance values were obtained for the standards at 373 nm: 0.135, 0.074, 0.044 and 0.023. A straight line was plotted between emission and absorbance to get a slope. The slope obtained from a straight line plot of the four absorbance measurements listed above was ~73661 arbitrary units. The measurements were made on a CARY Eclipse spectrophotometer. The CARY Eclipse settings used when taking the measurements were:

| Data mode | Fluorescence |
|---|---|
| Scan mode | Emission |
| X Mode | Wavelength (nm) |
| Start (nm) | 383.00 |
| Stop (nm) | 700.00 |
| Ex. Wavelength (nm) | 373.00 |
| Ex. Slit (nm) | 2.5 |
| Em. Slit (nm) | 2.5 |
| Scan rate (nm/min) | 600.00 |
| Data interval (nm) | 1.0000 |
| Averaging Time (s) | 0.1000 |
| Excitation filter | Auto |
| Emission filter | Open |
| PMT voltage (V) | Medium |
| Corrected spectra | OFF |

Other settings can be used and can be readily determined by one of ordinary skill in the art. Other brand spectrophotometers can be used to measure PL quantum efficiency and the settings to be used can be readily determined by one of ordinary skill in the art.

Semiconductor nanocrystals for which the % photoluminescence quantum efficiency is to be measured are dispersed in hexane and the absorbance at 373 nm is measured. The sample is excited at 373 nm using the same conditions as the standard and the emission area is measured.

Photoluminescence quantum yield can be calculated using the following equation:

PLQE={[maximum peak emission area of semiconductor nanocrystal×0.90×(1.375)$^2$]}/{[slope of line plot for standards×absorbance of semiconductor nanocrystal at 373 nm×(1.423)$^2$]} wherein, 0.90 is the PLQE of the standard used (DPA); 1.375 is the refractive index of hexane, 1.423 is the refractive index of cyclohexane, % Photoluminescence quantum yield can be calculated from the PLQE value using the following equation:

% PLQE=100×PLQE.

Preferably, the standard comprises an organic dye the photoluminescence spectrum of which overlaps significantly with that of the semiconductor nanocrystal sample. The standard samples and the semiconductor nanocrystal sample(s) are measured under the same settings of the spectrophotometer.

Semiconductor nanocrystals show strong quantum confinement effects that can be harnessed in designing bottom-up chemical approaches to create complex heterostructures with electronic and optical properties that are tunable with the size and composition of the semiconductor nanocrystals.

When an electron and hole localize on a semiconductor nanocrystal, emission can occur at an emission wavelength. The emission has a frequency that corresponds to the band gap of the quantum confined semiconductor material. The band gap is a function of the size of the semiconductor nanocrystal. Semiconductor nanocrystals having small diameters can have properties intermediate between molecular and bulk forms of matter. For example, semiconductor nanocrystals based on semiconductor materials having small diameters can exhibit quantum confinement of both the electron and hole in all three dimensions, which leads to an increase in the effective band gap of the material with decreasing nanocrystal size. Consequently, both the optical absorption and emission of semiconductor nanocrystals shift to the blue, or to higher energies, as the size of the nanocrystals decreases.

The emission from a semiconductor nanocrystal can be a narrow Gaussian emission band that can be tuned through the complete wavelength range of the ultraviolet, visible, or infra-red regions of the spectrum by varying the size of the semiconductor nanocrystal, the composition of the semiconductor nanocrystal, or both. For example, CdSe can be tuned in the visible region and InAs can be tuned in the infra-red region.

In certain embodiments, a population of semiconductor nanocrystals can have a narrow size distribution that can result in emission of light in a narrow spectral range. The population can be monodisperse preferably exhibits less than a 15% rms (root-mean-square) deviation in diameter of the semiconductor nanocrystals, more preferably less than 10%, most preferably less than 5%. In certain embodiments, spectral emissions in a narrow range of not greater than about 75 nm, more preferably not greater than about 60 nm, still more preferably not greater than about 40 nm, and most preferably not greater than about 30 nm full width at half max (FWHM) for semiconductor nanocrystals that emit in the visible can be observed. IR-emitting semiconductor nanocrystals preferably have a FWHM of not greater than about 150 nm, or more preferably not greater than about 100 nm. In certain embodiments, expressed in terms of the energy of the emission, an emission can have a FWHM of not greater than 0.05 eV, or not greater than 0.03 eV. The breadth of the emission decreases as the dispersity of semiconductor nanocrystal diameters decreases.

The narrow FWHM of semiconductor nanocrystals can result in saturated color emission. This can lead to efficient lighting devices even in the red and blue parts of the visible spectrum, since in semiconductor nanocrystal emitting devices no photons are lost to infra-red and UV emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A device including semiconductor nanocrystals of different compositions, sizes, and/or structures are capable of emitting light in more than one narrow range of wavelengths. The color of emitted light perceived by a viewer can be controlled by selecting appropriate combinations of semiconductor nanocrystal sizes and materials in the device as well as relative subpixel currents. The degeneracy of the band edge energy levels of semiconductor nanocrystals facilitates capture and radiative recombination of all possible excitons, whether generated by direct charge injection or energy transfer. The maximum theoretical semiconductor nanocrystal lighting device efficiencies are therefore comparable to the unity efficiency of phosphorescent organic light-emitting devices. The excited state lifetime ($\tau$) of the semiconductor nanocrystal is much shorter ($\tau$~10 ns) than a typical phosphor ($\tau$>0.1 $\mu$s), enabling semiconductor nanocrystal lighting devices to operate efficiently even at high current density and high brightness.

Semiconductor nanocrystals can be suitable for a variety of applications, including those disclosed in U.S. patent application Ser. No. 09/156,863, filed Sep. 18, 1998 (now U.S. Pat. No. 6,251,303), Ser. No. 09/160,454, filed Sep. 24, 1998 (now U.S. Pat. No. 6,326,144), Ser. No. 09/160,458, filed Sep. 24, 1998 (now U.S. Pat. No. 6,617,583), Ser. No. 09/350,956, filed Jul. 9, 1999 (now U.S. Pat. No. 6,803,719), and Ser. No. 10/400,908, filed Mar. 28, 2003 (U.S. Published Patent Application No. 20040023010), all of which are incorporated herein by reference in their entirety.

For example, the nanocrystals can be used in a variety of end-use applications and products. Such end-use applications and product include, but are not limited to, optoelectronic devices including light emitting diodes (LEDs) or alternating current devices (ACTFELDs), lasers, biomedical tags, photoelectric devices, solar cells, catalysts, and the like. Light-emitting devices including nanocrystals in accordance with the present invention may be incorporated into a wide variety of consumer products, including, but not limited to, flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control such devices, including passive matrix and active matrix.

Light-emitting devices including semiconductor nanocrystals can be made by spin-casting a solution containing the hole transport layer (HTL) organic semiconductor molecules and the semiconductor nanocrystals, where the HTL forms underneath the semiconductor nanocrystal layer via phase separation (see, for example, U.S. patent application Ser. Nos. 10/400,907 and 10/400,908, both filed Mar. 28, 2003, each of which is incorporated by reference in its entirety). In certain embodiments, this phase separation technique can be used to place a monolayer of semiconductor nanocrystals between an organic semiconductor HTL and electron transport layer (ETL), thereby effectively exploiting the favorable light emission properties of semiconductor nanocrystals, while minimizing their impact on electrical performance. Other techniques for depositing semiconductor nanocrystals include Langmuir-Blodgett techniques and drop-casting.

Some techniques for depositing semiconductor nanocrystals may not be well suited for all possible substrate materials, may involve use of chemicals that can affect the electrical or optical properties of the layer, may subject the substrate to harsh conditions, and/or may place constraints on the types of devices that can be grown in some way. Other techniques discussed below may be preferable if a patterned layer of semiconductor nanocrystals is desired.

Preferably, semiconductor nanocrystals are processed in a controlled (oxygen-free and moisture-free) environment, preventing the quenching of luminescent efficiency during the fabrication process.

In certain embodiments, semiconductor nanocrystals can be deposited in a patterned arrangement. Patterned semiconductor nanocrystals can be used to form an array of pixels comprising, e.g., red, green, and blue or alternatively, red, yellow, green, blue-green, and/or blue emitting, or other combinations of distinguishable color emitting subpixels, that are energized to produce light of a predetermined wavelength.

An example of a technique for depositing a light-emitting material comprising semiconductor nanocrystals in a pattern and/or in a multi-color pattern or other array is contact printing. Contact printing advantageously allows micron-scale (e.g., less than 1 mm, less than 500 microns, less than 200 microns, less than 100 microns, less than 50 microns, less than 25 microns, or less than 10 microns) patterning of features on a surface. Pattern features can also be applied at larger scales, such as 1 mm or greater, 1 cm or greater, 1 m or greater, 10 m or greater. Contact printing can allow dry (e.g., liquid free or substantially liquid free) application of a patterned semiconductor nanocrystal layer to a surface. In a pixilated device, the semiconductor nanocrystal layer comprises a patterned array of the semiconductor nanocrystals on the underlying layer. In instances where a pixel includes subpixels, the sizes of the subpixels can be a proportionate fraction of the pixel size, based on the number of subpixels.

Additional information and methods for depositing semiconductor nanocrystals are described in U.S. patent application Ser. No. 11/253,612 entitled "Method And System For Transferring A Patterned Material", filed 21 Oct. 2005, and Ser. No. 11/253,595 entitled "Light Emitting Device Including Semiconductor Nanocrystals", filed 21 Oct. 2005, each of which is hereby incorporated herein by reference in its entirety.

Other materials, techniques, methods, applications, and information that may be useful with the present invention are described in, U.S. Provisional Patent Application No. 60/792,170, of Seth Coe-Sullivan, et al., for "Composition Including Material, Methods Of Depositing Material, Articles Including Same And Systems For Depositing Material", filed on 14 Apr. 2006; U.S. Provisional Patent Application No. 60/792,084, of Maria J. Anc, For "Methods Of Depositing Material, Methods Of Making A Device, And System", filed on 14 Apr. 2006, U.S. Provisional Patent Application No. 60/792,086, of Marshall Cox, et al, for "Methods Of Depositing Nanomaterial & Methods Of Making A Device" filed on 14 Apr. 2006; U.S. Provisional Patent Application No. 60/792,167 of Seth Coe-Sullivan, et al, for "Articles For Depositing Materials, Transfer Surfaces, And Methods" filed on 14 Apr. 2006, U.S. Provisional Patent Application No. 60/792,083 of LeeAnn Kim et al., for "Applicator For Depositing Materials And Methods" filed on 14 Apr. 2006; U.S. Provisional Patent Application 60/793,990 of LeeAnn Kim et al., for "Applicator For Depositing Materials And Methods" filed by Express Mail on 21 Apr. 2006; U.S. Provisional Patent Application No. 60/790,393 of Seth Coe-Sullivan et al., for "Methods And Articles Including Nanomaterial", filed on 7 Apr. 2006; U.S.

Provisional Patent Application No. 60/805,735 of Seth Coe-Sullivan, for "Methods For Depositing Nanomaterial, Methods For Fabricating A Device, And Methods For Fabricating An Array Of Devices", filed on 24 Jun. 2006; U.S. Provisional Patent Application No. 60/805,736 of Seth Coe-Sullivan et al., for "Methods For Depositing Nanomaterial, Methods For Fabricating A Device, Methods For Fabricating An Array Of Devices And Compositions", filed on 24 Jun. 2006; U.S. Provisional Patent Application No. 60/805,738 of Seth Coe-Sullivan et al., for "Methods And Articles Including Nanomaterial", filed on 24 Jun. 2006; U.S. Provisional Patent Application No. 60/795,420 of Paul Beatty et al., for "Device Including Semiconductor Nanocrystals And A Layer Including A Doped Organic Material And Methods", filed on 27 Apr. 2006; U.S. Provisional Patent Application No. 60/804, 921 of Seth Coe-Sullivan et al., for "Light-Emitting Devices And Displays With Improved Performance", filed on 15 Jun. 2006, U.S. patent application Ser. No. 11/071,244 of Jonathan S. Steckel et al., for "Blue Light Emitting Semiconductor Nanocrystal Materials" 4 Mar. 2005 (including U.S. Patent Application No. 60/550,314, filed on 8 Mar. 2004, from which it claims priority), U.S. Provision Patent Application No. 60/825,373, filed 12 Sep. 2006, of Seth A. Coe-Sullivan et al., for "Light-Emitting Devices And Displays With Improved Performance"; U.S. Provision Patent Application No. 60/825,374, filed 12 Sep. 2006, of Seth A. Coe-Sullivan et al., for "Light-Emitting Devices And Displays With Improved Performance," U.S. Application No. 60/866, 262, filed 23 Jan. 2007, of Peter T. Kazlas et al., for "Light-Emitting Devices And Displays With Improved Performance", and International Application No. PCT/US2007/ 024310, filed on even date herewith, of Peter T. Kazlas et al., for "Light Emitting Devices And Displays With Improved Performance". The disclosures of each of the foregoing listed patent documents are hereby incorporated herein by reference in their entireties.

Other multilayer structures may optionally be used to improve the performance (see, for example, U.S. patent application Ser. Nos. 10/400,907 and 10/400,908, filed Mar. 28, 2003, each of which is incorporated herein by reference in its entirety) of the light-emitting devices and displays of the invention.

The performance of light emitting devices can be improved by increasing their efficiency, narrowing or broadening their emission spectra, or polarizing their emission. See, for example, Bulovic et al., Semiconductors and Semimetals 64, 255 (2000), Adachi et al., Appl. Phys. Lett. 78, 1622 (2001), Yamasaki et al., Appl. Phys. Lett. 76, 1243 (2000), Dirr et al., Jpn. J. Appl. Phys. 37, 1457 (1998), and D'Andrade et al., MRS Fall Meeting, BB6.2 (2001), each of which is incorporated herein by reference in its entirety. Semiconductor nanocrystals can be included in efficient hybrid organic/inorganic light emitting devices.

Because of the diversity of semiconductor nanocrystal materials that can be prepared, and the wavelength tuning via semiconductor nanocrystal composition, structure, and size, devices that are capable of emitting light of a predetermined color are possible with use of semiconductor nanocrystals as the emissive material. Semiconductor nanocrystal light-emitted devices can be tuned to emit anywhere in the spectrum.

The size and material of a semiconductor nanocrystal can be selected such that the semiconductor nanocrystal emits light having a predetermined wavelength.

Light-emitting devices can be prepared that emit visible or invisible (e.g., IR) light. The size and material of a semiconductor nanocrystal can be selected such that the semiconductor nanocrystal emits light having a predetermined wavelength. Light emission can be of a predetermined wavelength in any region of the spectrum, e.g., visible, infrared, etc. For example, the wavelength can be between 300 and 2,500 nm or greater, for instance between 300 and 400 nm, between 400 and 700 nm, between 700 and 1100 nm, between 1100 and 2500 nm, or greater than 2500 nm.

Individual light-emitting devices can be formed. In other embodiments, a plurality of individual light-emitting devices can be formed at multiple locations on a single substrate to form a display. A display can include a light-emitting device in accordance with the present invention and one or more additional devices that emit at the same or different wavelengths. By patterning the substrate with arrays of different color-emitting semiconductor nanocrystals, a display including pixels of different colors can be formed.

An individual light-emitting device or one or more light-emitting devices of a display can optionally include a mixture of different color-emitting semiconductor nanocrystals formulated to produce a white light. White light can alternatively be produced from a device including red, green, blue, and, optionally, additional color-emitting pixels.

Examples of other displays are included in U.S. Patent Application No. 60/771,643 for "Displays Including Semiconductor Nanocrystals And Methods Of Making Same", of Seth Coe-Sullivan et al., filed 9 Feb. 2006, the disclosure of which is hereby incorporated herein by reference in its entirety.

For additional information relating to semiconductor nanocrystals and their use, see also U.S. Patent Application Nos. 60/620,967, filed Oct. 22, 2004, and Ser. No. 11/032, 163, filed Jan. 11, 2005, U.S. patent application Ser. No. 11/071,244, filed 4 Mar. 2005. Each of the foregoing patent applications is hereby incorporated herein by reference in its entirety.

As used herein, the singular forms "a", "an" and "the" include plural unless the context clearly dictates otherwise. Thus, for example, reference to an emissive material includes reference to one or more of such materials.

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention. Additional embodiments of the present invention will also be apparent to those skilled in the art from consideration of the specification and practice of the invention disclosed herein. It is intended that the specification and examples be considered as exemplary only, with a true scope and spirit of the invention being indicated by the following claims and equivalents thereof.

All patents, patent applications, and publications mentioned above are herein incorporated by reference in their entirety for all purposes. None of the patents, patent applications, and publications mentioned above are admitted to be prior art.

What is claimed is:

1. A semiconductor nanocrystal comprising a core comprising a first semiconductor material, the first semiconductor material comprising an alloy, and a shell disposed over at least a portion of a surface of the core, the shell comprising a second semiconductor material, wherein the semiconductor nanocrystal is capable of emitting light with a photoluminescence quantum efficiency greater than about 85% upon excitation and including a maximum peak emission with a FWHM less than 20 nm.

2. A semiconductor nanocrystal in accordance with claim 1 wherein the semiconductor nanocrystal is capable of emitting light with a photoluminescence quantum efficiency greater than about 90% upon excitation.

3. A semiconductor nanocrystal in accordance with claim 1 wherein the semiconductor nanocrystal is capable of emitting light with a photoluminescence quantum efficiency greater than about 95% upon excitation.

4. A semiconductor nanocrystal in accordance with claim 1 wherein the semiconductor nanocrystal is capable of emitting light with a photoluminescence quantum efficiency of about 100% upon excitation.

5. A semiconductor nanocrystal in accordance with claim 1 wherein the second semiconductor material comprises one or more chemical elements.

6. A semiconductor nanocrystal in accordance with claim 1 wherein one or more ligands are attached thereto.

7. A semiconductor nanocrystal in accordance with claim 1 wherein the shell has a thickness in a range from greater than about 0 to about 20 monolayers.

8. A semiconductor nanocrystal in accordance with claim 1 wherein the first semiconductor material comprises three or more chemical elements.

9. A semiconductor nanocrystal in accordance with claim 1 wherein the second semiconductor material comprises two or more chemical elements.

10. A semiconductor nanocrystal in accordance with claim 1 wherein the first semiconductor material comprises zinc, cadmium, and sulfur.

11. A semiconductor nanocrystal in accordance with claim 1 wherein the second semiconductor material comprises zinc and sulfur.

12. A semiconductor nanocrystal in accordance with claim 1 wherein the first semiconductor material comprises $Zn_xCd_{1-x}S$, wherein $0<x<1$.

13. A semiconductor nanocrystal in accordance with claim 12 wherein $0<x\leq0.5$.

14. A semiconductor nanocrystal in accordance with claim 12 wherein the second semiconductor material comprises ZnS.

15. A composition comprising a semiconductor nanocrystal comprising a core comprising a first semiconductor material, the first semiconductor material comprising an alloy, and a shell disposed over at least a portion of a surface of the core, the shell comprising a second semiconductor material, wherein the semiconductor nanocrystal is capable of emitting light with a photoluminescence quantum efficiency greater than about 85% upon excitation and including a maximum peak emission with a FWHM less than 20 nm.

16. A composition in accordance with claim 15 wherein the composition further includes a polymer.

17. A composition in accordance with claim 15 wherein the composition further includes a pre-polymer.

18. A composition in accordance with claim 15 wherein the composition further includes an oligomer.

19. A composition in accordance with claim 15 wherein the composition further includes a small molecule.

20. A composition in accordance with claim 15 wherein the composition further includes an inorganic material.

21. A composition in accordance with claim 15 wherein the composition comprises a matrix.

22. A composition in accordance with claim 21 wherein the composition comprises a matrix in which the semiconductor nanocrystals are dispersed.

23. A composition in accordance with claim 21 wherein the matrix comprises an organic material.

24. A composition in accordance with claim 21 wherein the matrix comprises an inorganic material.

25. A composition in accordance with claim 15 the composition further includes a non-polar liquid in which the semiconductor nanocrystal is dispersible.

26. A composition in accordance with claim 15 the composition further includes a polar liquid in which the semiconductor nanocrystal is dispersible.

27. A composition in accordance with claim 15 wherein the first semiconductor material comprises $Zn_xCd_{1-x}S$, wherein $0<x<1$.

28. A composition in accordance with claim 27 wherein $0<x\leq0.5$.

29. A composition in accordance with claim 27 wherein the second semiconductor material comprises ZnS.

30. A semiconductor nanocrystal in accordance with claim 1 wherein the core emits light including a maximum peak emission with a FWHM less than 20 nm prior to disposition of the shell.

31. A population of semiconductor nanocrystals comprising a semiconductor nanocrystal in accordance with claim 1, wherein the population is capable of emitting light with a photoluminescence quantum efficiency greater than about 85% upon excitation and includes a maximum peak emission with a FWHM less than 20 nm.

* * * * *